(12) United States Patent
In

(10) Patent No.: US 11,741,903 B2
(45) Date of Patent: Aug. 29, 2023

(54) GATE DRIVER AND DISPLAY DEVICE INCLUDING THE SAME

(71) Applicant: Samsung Display Co., Ltd., Yongin-Si (KR)

(72) Inventor: Hai Jung In, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 0 days.

(21) Appl. No.: 17/846,276

(22) Filed: Jun. 22, 2022

(65) Prior Publication Data
US 2023/0178027 A1 Jun. 8, 2023

(30) Foreign Application Priority Data
Dec. 2, 2021 (KR) .................. 10-2021-0171274

(51) Int. Cl.
*G09G 3/3266* (2016.01)
*G09G 3/3233* (2016.01)

(52) U.S. Cl.
CPC ......... *G09G 3/3266* (2013.01); *G09G 3/3233* (2013.01); *G09G 2300/0426* (2013.01); *G09G 2300/0819* (2013.01); *G09G 2300/0842* (2013.01); *G09G 2310/08* (2013.01); *G09G 2330/021* (2013.01)

(58) Field of Classification Search
CPC .. G09G 3/3233; G09G 3/3266; G09G 3/3291; G09G 3/3674; G09G 2300/0426; G09G 2300/0819; G09G 2300/0842; G09G 2300/0861; G09G 2310/0286; G09G 2310/0289; G09G 2310/08; G09G 2320/0233; G09G 2320/0247; G09G 2330/021; G09G 2330/023
See application file for complete search history.

(56) References Cited

U.S. PATENT DOCUMENTS

| | | | |
|---|---|---|---|
| 9,311,856 B2 | 4/2016 | Park et al. | |
| 10,453,386 B2 | 10/2019 | Jang | |
| 2002/0011994 A1* | 1/2002 | Imamura | G09G 3/3692 345/204 |
| 2015/0194121 A1* | 7/2015 | Lee | G09G 3/3677 345/212 |
| 2020/0005881 A1* | 1/2020 | Liu | G11C 19/28 |
| 2020/0160792 A1* | 5/2020 | Park | G09G 3/3677 |

FOREIGN PATENT DOCUMENTS

| | | |
|---|---|---|
| KR | 10-1839953 B1 | 3/2018 |
| KR | 10-2021-0086238 A | 7/2021 |

\* cited by examiner

*Primary Examiner* — Michael J Eurice
(74) *Attorney, Agent, or Firm* — Innovation Counsel LLP

(57) ABSTRACT

A gate driver includes stages connected to clock signal lines to which clock signals are applied and a first gate power line to which a first gate power voltage is applied, and outputting the first gate power voltage as gate signals in response to the clock signals. The clock signals have a first frequency and the first gate power voltage has a first voltage level in a first period. The clock signals have a second frequency lower than the first frequency and the first gate power voltage has a second voltage level in a second period. One of the first and second voltage levels is a gate-on voltage level that turns on a transistor, and another of the first and second voltage levels is a gate-off voltage level that turns off the transistor.

35 Claims, 24 Drawing Sheets

GATE DRIVER AND DISPLAY DEVICE INCLUDING THE SAME

This application claims priority to Korean Patent Application No. 10-2021-0171274, filed on Dec. 02, 2021, and all the benefits accruing therefrom under 35 U.S.C. § 119, the content of which in its entirety is herein incorporated by reference.

BACKGROUND

1. Field

The disclosure relates to a gate driver and a display device including the same.

2. Description of the Related Art

A display device includes a data driver, a gate driver, and pixels. The data driver provides data signals to the pixels through data lines. The gate driver generates a gate signal using gate power and a clock signal provided from outside, and sequentially provides the gate signal to the pixels through gate lines. For example, the gate driver outputs the gate power as a gate signal of a gate-on voltage level in response to the clock signal. Each of the pixels may write a corresponding data signal in response to the gate signal and emit light in response to the data signal.

SUMMARY

A display device may display an image using a variable frequency driving method in which a driving frequency of a gate driver is varied.

An object of the disclosure is to provide a gate driver and a display device including the same capable of preventing reduction of display quality while reducing power consumption during low-frequency driving.

Objects of the disclosure are not limited to the object described above, and other technical objects which are not described will be clearly understood by those skilled in the art from the following description.

According to embodiments of the disclosure, a gate driver includes stages connected to clock signal lines to which clock signals are applied and a first gate power line to which a first gate power voltage is applied, and outputting the first gate power voltage as gate signals in response to the clock signals. The clock signals have a first frequency and the first gate power voltage has a first voltage level in a first period. The clock signals have a second frequency lower than the first frequency and the first gate power voltage has a second voltage level in a second period. One of the first and second voltage levels is a gate-on voltage level that turns on a transistor and another of the first and second voltage levels is a gate-off voltage level that turns off the transistor.

The second voltage level may be lower than the first voltage level.

The gate signals having the first voltage level may be sequentially output in the first period, and the gate signals may be maintained as the second voltage level during the second period.

The stages may be connected to a reference gate power line to which a reference gate power voltage having the second voltage level is applied, and a first stage among the stages may include at least one transistor and connect an output terminal to the first gate power line or the reference gate power line in response to the clock signals and a previous gate signal provided from a previous stage to output a gate signal through the output terminal.

The clock signals may be maintained as the first voltage level during the second period.

The first gate power voltage may fall from the first voltage level to the second voltage level in a state in which the clock signals are maintained as the first voltage level.

The clock signal may be maintained as the second voltage level during most of the second period.

The first gate power voltage may fall from the first voltage level to the second voltage level at a start time point of the second period, and the clock signals may fall from the first voltage level to the second voltage level after the start time point.

The first gate power voltage may rise from the second voltage level to the first voltage level at an end time point of the second period, and the clock signals may rise from the second voltage level to the first voltage level before the end time point.

The stages may be connected to a second gate power line to which a second gate power voltage is applied, and the first stage may include a node control circuit configured to control a voltage of a first control node in response to the clock signals and the previous gate signal, and an output circuit connecting the first gate power line to the output terminal in response to the voltage of the first control node.

The second gate power voltage may have the first voltage level in the first period and have the second voltage level in the second period.

The first gate power voltage may fall from the first voltage level to the second voltage level at a first time point of the second period, the second gate power voltage may fall from the first voltage level to the second voltage level at a second time point of the second period, and the second time point may be later than the first time point.

The first gate power voltage and the second gate power voltage may simultaneously rise from the second voltage level to the first voltage level at a third time point of the second period, and the third time point may be later than the second time point.

The clock signals may fall from the first voltage level to the second voltage level at a fourth time point of the second period, and the fourth time point may be later than the second time point.

The clock signals may rise from the second voltage level to the first voltage level at a fifth time point of the second period, the first gate power voltage may rise from the second voltage level to the first voltage level at an end time point of the second period, and the fifth time point may be earlier than the end time point.

The output circuit may include a pull-up transistor including a first electrode connected to the first gate power line, a second electrode connected to the output terminal, and a gate electrode connected to the first control node, and a pull-down transistor including a first electrode connected to the output terminal, a second electrode connected to the reference gate power line, and a gate electrode connected to a second control node.

The clock signal lines may include a first clock signal line and a second clock signal line, and the node control circuit may include a first transistor including a first electrode connected to an input terminal, a second electrode, and a gate electrode connected to the first clock signal line, a second transistor including a first electrode connected to the second gate power line, a second electrode, and a gate electrode, a third transistor including a first electrode connected to the second electrode of the second transistor, a second electrode connected to the second clock signal line, and a gate electrode connected to the second control node, a fourth transistor including a first electrode connected to the gate electrode of the second transistor, a second electrode connected to the first clock signal line, and a gate electrode connected to the second electrode of the first transistor, a fifth transistor including a first electrode connected to the first electrode of the fourth transistor, a second electrode connected to the reference gate power line, and a gate electrode connected to the first clock signal line, a first coupling transistor including a first electrode connected to the first electrode of the fifth transistor, a second electrode, and a gate electrode connected to the reference gate power line, a coupling capacitor including a first electrode connected to the second electrode of the first coupling transistor, and a second electrode, a sixth transistor including a first electrode connected to the first control node, a second electrode connected to the second electrode of the coupling capacitor, and a gate electrode connected to the second clock signal line, and a seventh transistor including a first electrode connected to the second electrode of the coupling capacitor, a second electrode connected to the second clock signal line, and a gate electrode connected to the first electrode of the coupling capacitor.

The node control circuit may further include a capacitor including a first electrode connected to the second electrode of the second transistor and a second electrode connected to the gate electrode of the third transistor, and a second coupling transistor including a first electrode connected to the second electrode of the first transistor, a second electrode connected to the second control node, and a gate electrode connected to the reference gate power line.

The first stage may further include an eighth transistor including a first electrode connected to the first gate power line, a second electrode connected to the first control node, and a gate electrode connected to the second electrode of the first transistor.

The first stage may further include a first capacitor including a first electrode connected to the second gate power line and a second electrode connected to the first control node.

The first stage may further include a first capacitor including a first electrode connected to the first gate power line and a second electrode connected to the first control node.

The first stage may further include a reset transistor including a first electrode connected to the first gate power line, a second electrode connected to a second electrode of the first transistor, and a gate electrode connected to a reset line.

The first stage may further include a reset transistor including a first electrode connected to the second gate power line, a second electrode connected to the gate electrode of the fourth transistor, and a gate electrode connected to a reset line.

The node control circuit may include a first auxiliary transistor including a first electrode connected to the gate electrode of the third transistor, a second electrode connected to the second control node, and a gate electrode connected to the gate electrode of the third transistor, a second auxiliary transistor including a first electrode connected to the input terminal, a second electrode, and a gate electrode connected to the first clock signal line, and a third auxiliary transistor including a first electrode connected to the second electrode of the second auxiliary transistor, a second electrode connected to the gate electrode of the third transistor, and a gate electrode connected to the reference gate power line.

The clock signal lines may include a first clock signal line and a second clock signal line, and the node control circuit may include a first transistor including a first electrode connected to an input terminal, a second electrode, and a gate electrode connected to the first clock signal line, a second transistor including a first electrode connected to the second gate power line, a second electrode, and a gate electrode, a third transistor including a first electrode connected to the second electrode of the second transistor, a second electrode connected to the second electrode of the first transistor, and a gate electrode connected to the second clock signal line, a fourth transistor including a first electrode connected to the gate electrode of the second transistor, a second electrode connected to the first clock signal line, and a gate electrode connected to the second electrode of the first transistor, a fifth transistor including a first electrode connected to the first electrode of the fourth transistor, a second electrode connected to the reference gate power line, and a gate electrode connected to the first clock signal line, a first coupling transistor including a first electrode connected to the first electrode of the fifth transistor, a second electrode, and a gate electrode connected to the reference gate power line, a coupling capacitor including a first electrode connected to the second electrode of the first coupling transistor, and a second electrode, a sixth transistor including a first electrode connected to the first control node, a second electrode connected to the second electrode of the coupling capacitor, and a gate electrode connected to the second clock signal line, and a seventh transistor including a first electrode connected to the second electrode of the coupling capacitor, a second electrode connected to the second clock signal line, and a gate electrode connected to the first electrode of the coupling capacitor.

The node control circuit may further include a capacitor including a first electrode connected to the second control node and a second electrode connected to the second clock signal line, and a second coupling transistor including a first electrode connected to the second electrode of the first transistor, a second electrode connected to the second control node, and a gate electrode connected to the reference gate power line.

The first stage may further include a first capacitor including a first electrode connected to the second gate power line and a second electrode connected to the first control node.

The first stage may further include a first capacitor including a first electrode connected to the first gate power line and a second electrode connected to the first control node.

The clock signal lines may include a first clock signal line and a second clock signal line, and the node control circuit may include a first transistor including a first electrode connected to an input terminal, a second electrode, and a gate electrode connected to the first clock signal line, a second transistor including a first electrode connected to the second gate power line, a second electrode, and a gate electrode, a third transistor including a first electrode connected to the second electrode of the second transistor, a second electrode connected to the second clock signal line, and a gate electrode connected to the second control node, a fourth transistor including a first electrode connected to the gate electrode of the second transistor, a second electrode connected to a carry input terminal, and a gate electrode connected to the first clock signal line, a first coupling transistor including a first electrode connected to the first electrode of the fourth transistor, a second electrode, and a gate electrode connected to the reference gate power line, a coupling capacitor including a first electrode connected to the second electrode of the first coupling transistor and a second electrode connected to a carry output terminal, a sixth transistor including a first electrode connected to the first control node, a second electrode connected to the second electrode of the coupling capacitor, and a gate electrode connected to the second clock signal line, and a seventh transistor including a first electrode connected to the second electrode of the coupling capacitor, a second electrode connected to the second clock signal line, and a gate electrode connected to the first electrode of the coupling capacitor, and the carry input terminal of a second stage among the stages may be connected to the carry output terminal of the first stage.

The first stage may further include a reset transistor including a first electrode connected to a reset line, a second electrode connected to the first control node, and a gate electrode connected to the reset line.

According to embodiments of the disclosure, a display device includes a display panel including gate lines and pixels connected to the gate lines, a gate driver including stages outputting gate signals to the gate lines, a timing controller configured to provide clock signals to the gate driver, and a power supply configured to provide a gate power voltage having a first voltage level and a reference gate power voltage having a second voltage level lower than the first voltage level to the gate driver. Each of the stages outputs the gate power voltage or the reference gate power voltage as a gate signal in response to the clock signal and a previous gate signal provided from a previous stage. The power supply provides the gate power voltage having the first voltage level to the gate driver in a first period. The timing controller constantly maintains the clock signals as one of the first voltage level and the second voltage level, and the power supply provides the gate power voltage having the second voltage level to the gate driver during a second period.

The clock signals may be maintained as the first voltage level during the second period.

The clock signal may be maintained as the second voltage level during most of the second period.

The gate power voltage may fall from the first voltage level to the second voltage level at a first time point of the second period, the clock signals may fall from the first voltage level to the second voltage level at a second time point of the second period, and the second time point may be later than the first time point.

The clock signals may rise from the second voltage level to the first voltage level at a third time point of the second period, the gate power voltage may rise from the second voltage level to the first voltage level at a fourth time point of the second period, the third time point may be later than the second time point, and the fourth time point may be later than the third time point.

Details of other embodiments are included in the detailed description and drawings.

The gate driver and the display device according to embodiments of the disclosure may reduce power consumption by reducing frequencies of the clock signals during the second period (for example, a hold period in which the gate signals are held as the second voltage level).

In addition, the gate driver and the display device may maintain the first gate power voltage as the second voltage level (for example, a low level) during the second period, thereby preventing a variation of the gate signals and reduction of display quality due to the variation of the gate signals.

Furthermore, the gate driver and the display device may maintain the clock signals as the second voltage level (for example, the low level) in the second period, and thus the gate signals may be more robustly held to the second voltage level.

An effect according to embodiments is not limited by the contents exemplified above, and more various effects are included in the present specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENT

Figure 1:
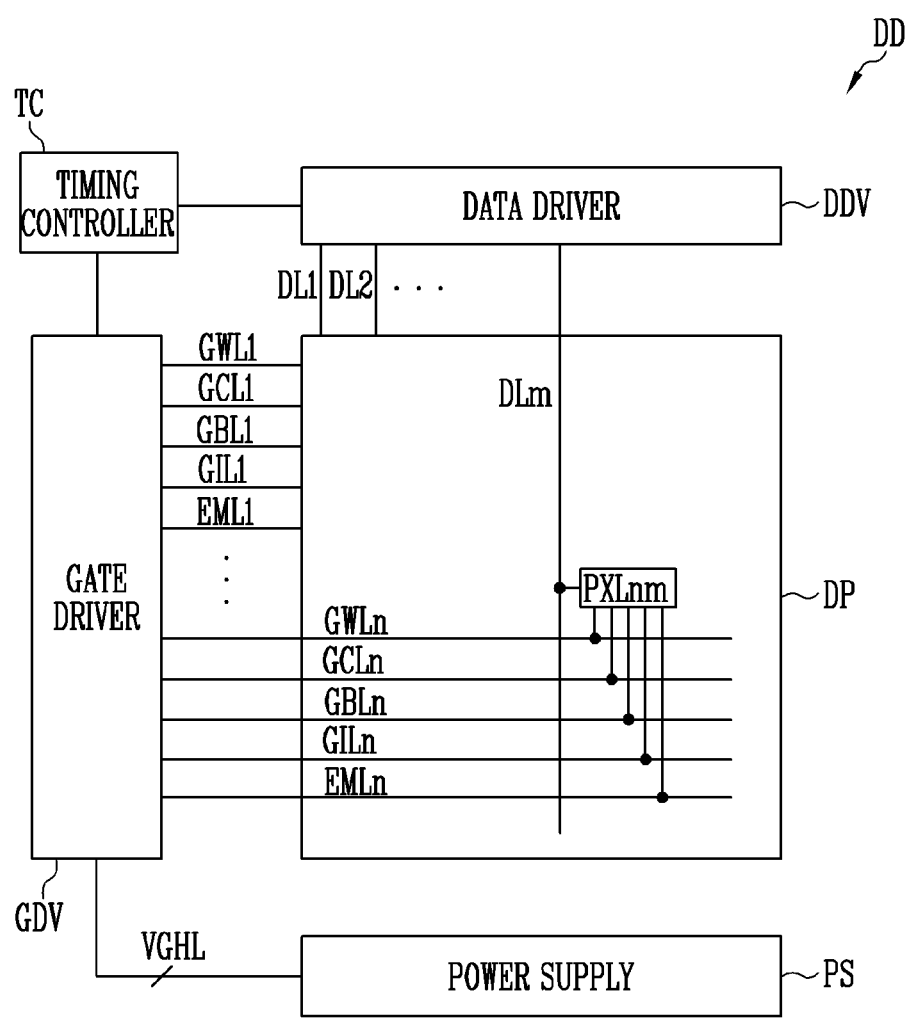
FIG. 1 is a block diagram illustrating a display device according to embodiments of the disclosure.

The disclosure may be modified in various ways and may have various forms, and specific embodiments will be illustrated in the drawings and described in detail herein. In the following description, the singular forms also include the plural forms unless the context clearly includes the singular.

Some embodiments are described in the accompanying drawings in relation to functional block, unit, and/or module. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the inventive concept. In addition, in some embodiments, the block, unit and/or module may be physically combined into more complex blocks, units, and/or modules without departing from the scope of the inventive concept.

Meanwhile, the disclosure is not limited to the embodiments disclosed below, and may be modified in various forms and may be implemented. In addition, each of the embodiments disclosed below may be implemented alone or in combination with at least one of other embodiments.

In the drawings, some components which are not directly related to a characteristic of the disclosure may be omitted to clearly represent the disclosure. In addition, some components in the drawings may be shown with a slightly exaggerated, size, ratio, or the like. Throughout the drawings, the same or similar components will be given by the same reference numerals and symbols as much as possible even though they are shown in different drawings, and repetitive descriptions will be omitted.

FIG. 1 is a block diagram illustrating a display device according to embodiments of the disclosure.

Referring to FIG. 1, the display device DD may include a timing controller TC, a data driver DDV, a gate driver GDV (or a scan/emission driver), and a display panel DP. In addition, the display device DD may further include a power supply PS.

The timing controller TC may receive an external input signal from an external processor. The external input signal may include a vertical synchronization signal, a horizontal synchronization signal, a data enable signal, RGB data, and a clock signal.

The vertical synchronization signal may include a plurality of pulses. A previous frame period may be ended and a current frame period may be started in synchronization with a time point at which each of the pulses is generated. An interval between adjacent pulses among the pulses of the vertical synchronization signal may correspond to one frame period. The horizontal synchronization signal may include a plurality of pulses. A previous horizontal period may be ended and a new horizontal period may be started in synchronization with a time point at which each of the pulses is generated. An interval between adjacent pulses among the pulses of the horizontal synchronization signal may correspond to one horizontal period. The data enable signal may indicate that RGB data is supplied in a horizontal period. For example, the RGB data may be supplied to pixels connected to the same write gate line in horizontal periods in response to the data enable signal.

The timing controller TC may generate grayscale values based on the RGB data to correspond to a specification of the display device DD. For example, the grayscale values may mean RGB data rearranged in response to resolution or the like of the display panel DP.

In addition, the timing controller TC may generate control signals for the data driver DDV and the gate driver GDV based on the external input signal to correspond to the specification of the display device DD.

The data driver DDV may generate data voltages (or data signals) using the grayscale values and the control signals received from the timing controller TC, and provide the data voltages to data lines DL1, DL2, and DLm. Here, m may be a positive integer. For example, the data driver DDV may sample the grayscale values using a clock signal, generate the data voltages corresponding to the grayscale values, and supply the data voltages to the data lines DL1, DL2, and DLm one pixel row at a time.

The gate driver GDV may receive the control signals from the timing controller TC, generate gate signals in response to the control signals, and provide the gate signals to gate lines GWL1, GCL1, GBL1, GILL EML1, GWLn, GCLn, GBLn, GILn, and EMLn. Here, n may be a positive integer.

In embodiments, the gate driver GDV may receive gate power voltages from the power supply PS through gate power lines VGHL, and provide gate signals having a voltage level corresponding to the gate power voltage to the gate lines GWL1, GCL1, GBL1, GILL EML1, GWLn, GCLn, GBLn, GILn, and EMLn. For example, the gate power voltages may have a high level during a first period and may have a low level during a second period. The first period and the second period may be included in one frame period, and for example, during low-frequency driving, the first period may be a period in which a scan operation is performed (for example, a driving period or a driving time), and the second period may be a period in which the scan operation is not performed (for example, a hold period or a hold time).

A detailed configuration of the gate driver is described later with reference to FIG. 4.

The display panel DP may include pixels PXLnm. For example, the pixel PXLnm may be connected to corresponding data line DLm, write gate line GWLn, compensation gate line GCLn, bypass gate line GBLn, initialization gate line GILn, and an emission gate line EMLn.

The power supply PS may supply the gate power voltages to the gate driver GDV through the gate power lines VGHL.

The power supply PS may be implemented as an independent integrated circuit (for example, a PMIC), but is not limited thereto. For example, the power supply PS may be implemented as one integrated circuit together with the data driver DDV. That is, the gate power voltages may be provided from the data driver DDV to the gate driver GDV.

Figure 2:
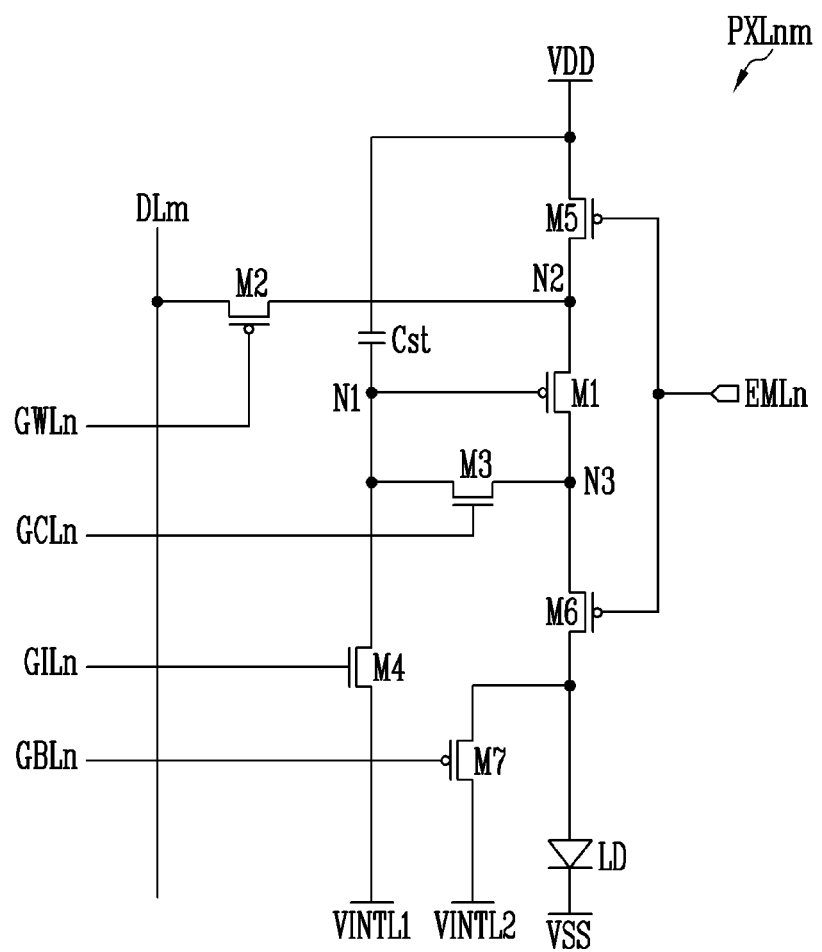
FIG. 2 is a circuit diagram illustrating an embodiment of a pixel included in the display device of FIG. 1.

FIG. 2 is a circuit diagram illustrating an embodiment of the pixel included in the display device of FIG. 1. For convenience of description, FIG. 2 shows a pixel PXLnm positioned on an n-th horizontal line (or an n-th pixel row) and connected to an m-th data line DLm.

Referring to FIGS. 1 and 2, the pixel PXLnm may include thin film transistors M1 to M7, a storage capacitor Cst, and a light emitting element LD.

A first electrode of the first thin film transistor M1 may be connected to a second node N2, a second electrode of the first thin film transistor M1 may be connected to a third node N3, and a gate electrode of the first thin film transistor M1 may be connected to a first node N1. The first thin film transistor M1 may be referred to as a driving transistor.

The first thin film transistor M1 may control a current amount flowing from a first power supply line VDD to a second power supply line VSS via the light emitting element LD in response to a voltage of the first node N1.

A first electrode of the second thin film transistor M2 may be connected to the data line DLm, a second electrode of the second thin film transistor M2 may be connected to the first electrode of the first thin film transistor M1 (or the second node N2), and a gate electrode of the second thin film transistor M2 may be connected to the write gate line GWLn. The second thin film transistor M2 may be referred to as a switching transistor.

The second thin film transistor M2 may be turned on when a write gate signal is supplied to the write gate line GWLn to electrically connect the data line DLm and the first electrode of the first thin film transistor M1.

A first electrode of the third thin film transistor M3 may be connected to the gate electrode of the first thin film transistor M1 (or the first node N1), a second electrode of the third thin film transistor M3 may be connected to the second electrode of the first thin film transistor M1 (or the third node N3), and a gate electrode of the third thin film transistor M3 may be connected to the compensation gate line GCLn. The third thin film transistor M3 may be referred to as a compensation transistor.

The third thin film transistor M3 may be turned on when a compensation gate signal is supplied to the compensation gate line GCLn to electrically connect the first node N1 and the third node N3. Therefore, when the third thin film transistor M3 is turned on, the first thin film transistor M1 may be diode connected.

A first electrode of the fourth thin film transistor M4 may be connected to the gate electrode of the first thin film transistor M1 (or the first node N1), a second electrode of the fourth thin film transistor M4 may be connected to a first initialization line VINTL1 (or a third power line), and a gate electrode of the fourth thin film transistor M4 may be connected to the initialization gate line GILn. The fourth thin film transistor M4 may be referred to as an initialization transistor.

The fourth thin film transistor M4 may be turned on when an initialization gate signal is supplied to the initialization gate line GILn to connect the first node N1 to the first initialization line VINTL1.

A first electrode of the fifth thin film transistor M5 may be connected to the first power supply line VDD, a second electrode of the fifth thin film transistor M5 may be connected to the first electrode of the first thin film transistor T1 (or the second node N2), and a gate electrode of the fifth thin film transistor M5 may be connected to the emission gate line EMLn. The fifth thin film transistor M5 may be referred to as a first emission transistor.

A first electrode of the sixth thin film transistor M6 may be connected to the second electrode of the first thin film transistor M1 (or the third node N3), a second electrode of the sixth thin film transistor M6 may be connected to a first electrode (or an anode electrode) of the light emitting element LD, and a gate electrode of the sixth thin film transistor M6 may be connected to the emission gate line EMLn. The sixth thin film transistor M6 may be referred to as a second emission transistor.

The fifth and sixth thin film transistors M5 and M6 may be turned off when an emission gate signal of a turn-off level is supplied to the emission gate line EMLn, and may be turned on when an emission gate signal of a turn-on level is supplied to the emission gate line EMLn.

A first electrode of the seventh thin film transistor M7 may be connected to the first electrode of the light emitting element LD, a second electrode of the seventh thin film transistor M7 may be connected to a second initialization line VINTL2 (or a fourth power line), and a gate electrode of the seventh thin film transistor M7 may be connected to the bypass gate line GBLn. The seventh thin film transistor M7 may be referred to as a bypass transistor.

The seventh thin film transistor M7 may be turned on when a bypass gate signal is supplied to the bypass gate line GBLn to connect the first electrode of the light emitting element LD to the second initialization line VINTL2.

The storage capacitor Cst may be formed or connected between the first power supply line VDD and the gate electrode of the first thin film transistor M1 (or the first node N1). For example, a first electrode of the storage capacitor Cst may be connected to the first power supply line VDD and a second electrode of the storage capacitor Cst may be connected to the gate electrode of the first thin film transistor M1. The storage capacitor Cst may store a data voltage and a voltage corresponding to a threshold voltage of the first thin film transistor M1 (for example, a voltage in which the threshold voltage of the first thin film transistor M1 is reflected in the data voltage).

The first electrode of the light emitting element LD may be connected to the second electrode of the sixth thin film transistor M6, and a second electrode (or a cathode electrode) of the light emitting element LD may be connected to the second power supply line VSS. The light emitting element LD may generate light of a predetermined luminance in response to the current supplied from the first thin film transistor M1.

The light emitting element LD may be configured of an organic light emitting diode or an inorganic light emitting diode such as a micro light emitting diode (LED) or a quantum dot light emitting diode. In addition, the light emitting element LD may be a light emitting element in which an organic material and an inorganic material are combined. In FIG. 2, the pixel PXLnm includes a single light emitting element LD, but in another embodiment, the pixel PXLnm may include a plurality of light emitting elements LD, and the plurality of light emitting elements LD may be connected to each other in series, in parallel, or in series-parallel.

A voltage applied to the first power supply line VDD may be set to be higher than voltages applied to the first initialization line VINTL1, the second initialization line VINTL2, and the second power supply line VSS.

The first, second, fifth, sixth, and seventh thin film transistors M1, M2, M5, M6, and M7 may be P-type transistors. Channels of the first, second, fifth, sixth, and seventh thin film transistors M1, M2, M5, M6, and M7 may be formed of poly silicon. The poly silicon transistor may be a low temperature poly silicon (LTPS) transistor. The poly silicon transistors have high electron mobility, and thus have a fast driving characteristic.

The third and fourth thin film transistors M3 and M4 may be N-type transistors. Channels of the third and fourth thin film transistors M3 and M4 may be formed of an oxide semiconductor. The oxide semiconductor transistors have low charge mobility compared to poly silicon transistors. Therefore, a leakage current amount generated in a turn-off state of the oxide semiconductor transistors is less than that of the poly silicon transistors.

Figure 3:
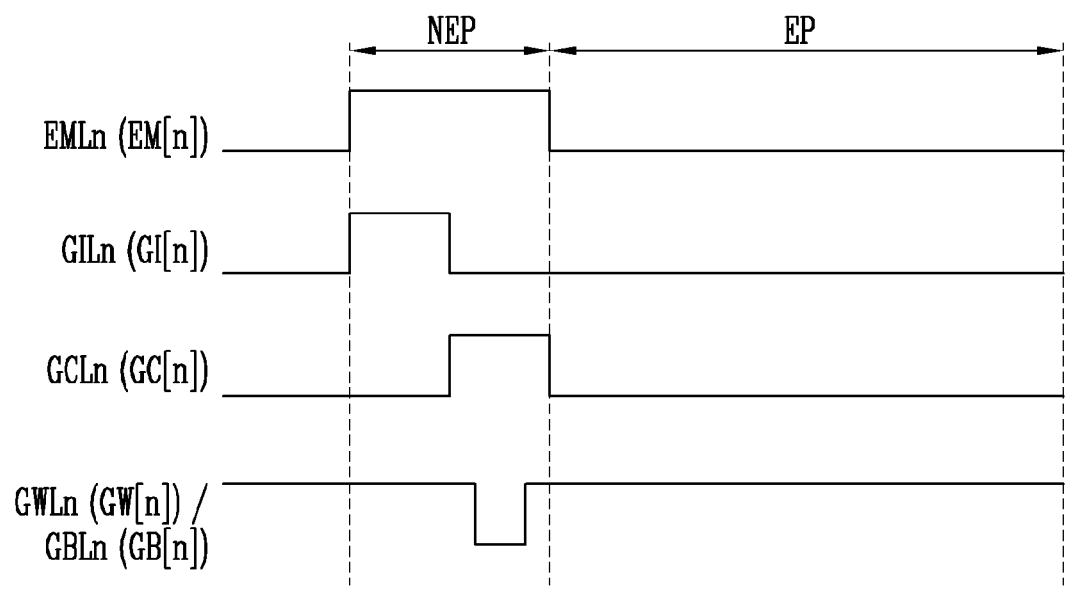
FIG. 3 is a timing diagram illustrating an operation of the pixel of FIG. 2.

FIG. 3 is a timing diagram illustrating an operation of the pixel of FIG. 2.

Referring to FIGS. 1 to 3, the pixel PXLnm may receive signals for image display in a non-emission period NEP and emit light based on the signals in an emission period EP.

A gate-on voltage of a compensation gate signal GC[n] supplied to the compensation gate line GCLn connected to the third thin film transistor M3 which is the N-type transistor is a high level. A gate-on voltage of an initialization gate signal GI[n] supplied to the initialization gate line GILn connected to the fourth thin film transistor M4 which is the N-type transistor is a high level. A gate-on voltage of a write gate signal GW[n] supplied to the write gate line GWLn connected to the second thin film transistor M2 which is the P-type transistor is a low level. A gate-on voltage of a bypass gate signal GB [n] supplied to the bypass gate line GBLn connected to the seventh thin film transistor M7 which is the P-type transistor is a low level. A gate-on voltage of an emission gate signal EM[n] supplied to the emission gate line EMLn connected to the fifth and sixth thin film transistors M5 and M6 which are the P-type transistors is a low level.

First, the emission gate signal EM[n] is supplied to the emission gate line EMLn. In this case, the fifth and sixth thin film transistors M5 and M6 are turned off, and the pixel PXLnm is set to a non-emission state.

Thereafter, the initialization gate signal GI[n] is supplied to the initialization gate line GILn. In this case, the fourth thin film transistor M4 is turned on, and the voltage of the first initialization line VINTL1 is supplied to the first node N1.

Thereafter, the compensation gate signal GC[n] is supplied to the compensation gate line GCLn. In this case, the third thin film transistor M3 may be turned on, the first thin film transistor M1 may be connected in the diode form, and the threshold voltage of the first thin film transistor M1 may be compensated.

When the write gate signal GW[n] is supplied to the write gate line GWLn, the second thin film transistor M2 is turned on, and the data signal from the data line DLm is supplied to the second node N2. At this time, since the first node N1 is initialized to the voltage of the first initialization line VINTL1 lower than the data signal (for example, initialized to an on-bias state), the first thin film transistor M1 is turned on.

When the first thin film transistor M1 is turned on, the data signal supplied to the second node N2 is supplied to the first node N1 via the first thin film transistor M1 which is connected in the diode form. Then, the voltage corresponding to the data signal and the threshold voltage of the first thin film transistor M1 are applied to the first node N1. At this time, the storage capacitor Cst stores a voltage difference between the first node N1 and the first power supply line VDD.

In addition, a bypass gate signal GB [n] is supplied to the bypass gate line GBLn. In this case, the seventh thin film transistor M7 is turned on, and the voltage of the second initialization line VINTL2 is supplied to the first electrode of the light emitting element LD. Accordingly, a residual voltage remaining in a parasitic capacitor of the light emitting element LD may be discharged.

Thereafter, the supply of the emission gate signal EM[n] to the emission gate line EMLn is stopped. In this case, the fifth and sixth thin film transistors M5 and M6 are turned on. The first thin film transistor M1 controls a driving current flowing to the light emitting element LD in response to the voltage of the first node N1. Then, the light emitting element LD generates light of a luminance corresponding to the current amount of the driving current.

Figure 4:
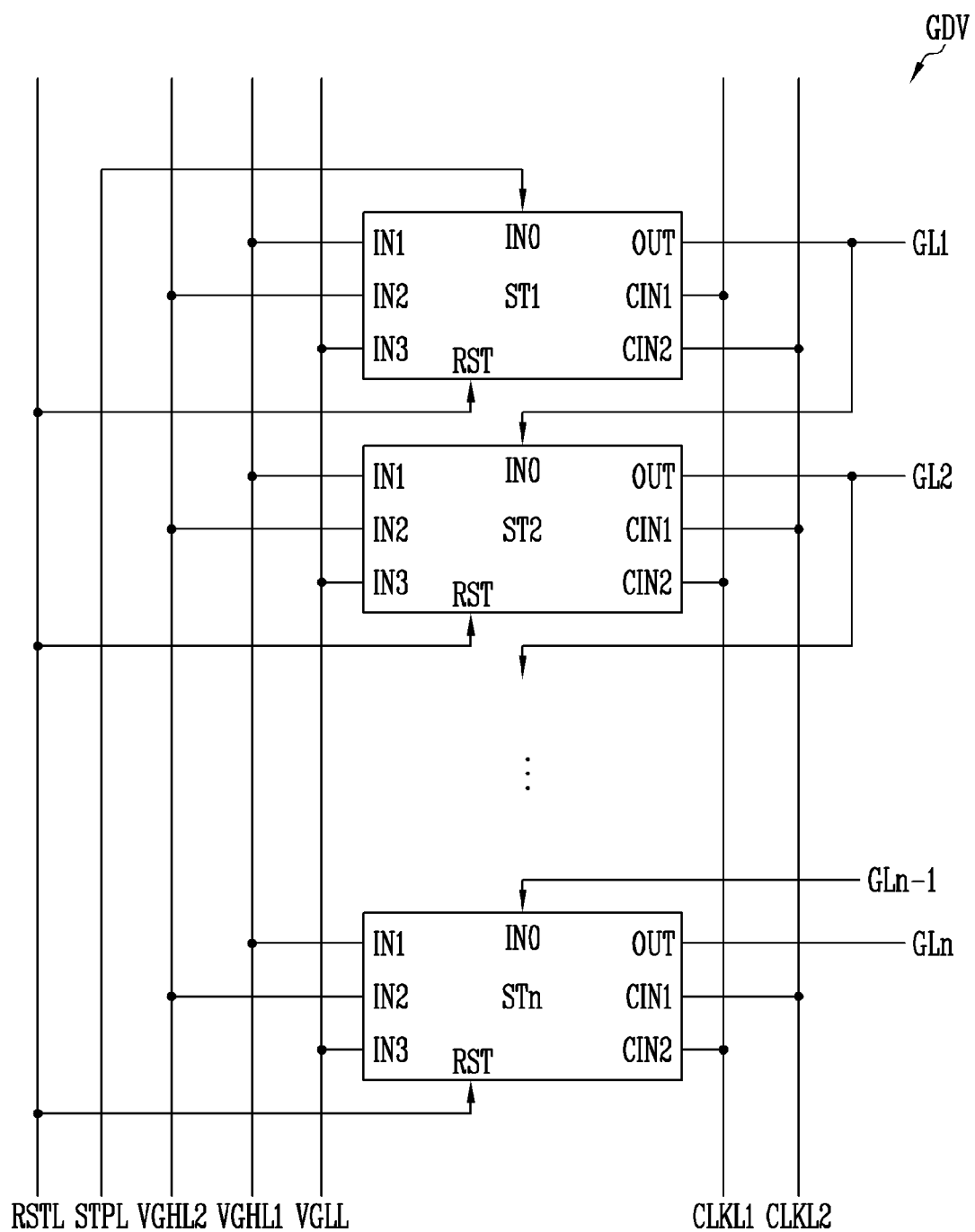
FIG. 4 is a diagram illustrating an embodiment of a gate driver included in the display device of FIG. 1.

FIG. 4 is a diagram illustrating an embodiment of the gate driver included in the display device of FIG. 1.

Referring to FIGS. 1 to 4, the gate driver GDV may include a plurality of stages ST1, ST2, and STn.

The stages ST1, ST2, and STn may provide gate signals to the gate lines GL1, GL2, and GLn, respectively. Here, the gate lines GL1, GL2, and GLn may correspond to the compensation gate line GCLn, the initialization gate line GILn, or the emission gate line EMLn described with reference to FIGS. 1 and 2, and the gate signals may correspond to the compensation gate signal GC[n], the initialization gate signal GI[n], or the emission gate signal EM[n] described with reference to FIGS. 1 to 3.

Each of the stages ST1, ST2, and STn may include an input terminal IN0, a first power input terminal IN1, a second power input terminal IN2, a third power input terminal IN3, a first clock input terminal CIN1, a second clock input terminal CIN2, a reset terminal RST, and an output terminal OUT. As will be described later with reference to FIG. 5, an internal circuit configuration of the stages ST1, ST2, and STn may be substantially identical to each other.

Each of the stages ST1, ST2, and STn may be connected to a first gate power line VGHL1, a second gate power line VGHL2, a reference gate power line VGLL, first and second clock signal lines CLKL1 and CLKL2, and a reset signal line RSTL. Here, a reference gate power voltage may be applied to the reference gate power line VGLL from the power supply PS (refer to FIG. 1), and the reference gate power voltage may have a voltage level (for example, a low level) lower than a gate power voltage (for example, a high level) applied to the first and second gate power lines VGHL1 and VGHL2. Clock signals may be applied to the first and second clock signal lines CLKL1 and CLKL2 from the timing controller TC (refer to FIG. 1). As will be described later with reference to FIG. 6, the second clock signal applied to the second clock signal line CLKL2 may have a phase delayed from the first clock signal applied to the first clock signal line CLKL1. For example, the second clock signal may have a phase delayed by 180 degrees (or an inverted phase) from the first clock signal. A reset signal may be applied to the reset signal line RSTL from the timing controller TC (refer to FIG. 1) when the display device DD (refer to FIG. 1) is powered on and/or powered off. Meanwhile, a start signal (or a start pulse) may be applied to a start signal line STPL from the timing controller TC (refer to FIG. 1).

For example, in each of the stages ST1, ST2, and STn, the first power input terminal IN1 may be connected to the first gate power line VGHL1, the second power input terminal IN2 may be connected to the second gate power line VGHL2, the third power input terminal IN3 may be connected to the reference gate power line VGLL, and the reset terminal RST may be connected to the reset signal line RSTL.

For example, in the first stage ST1 (or an odd-numbered stage), the first clock input terminal CIN1 may be connected to the first clock signal line CLKL1, and the second clock input terminal CIN2 may be connected to the second clock signal line CLKL2. In the second stage ST2 (an even-numbered stage), the first clock input terminal CIN1 may be connected to the second clock signal line CLKL2, and the second clock input terminal CIN2 may be connected to the first clock signal line CLKL1.

In an embodiment, in each of the stages ST1, ST2, and STn, the gate power voltage applied to the second power input terminal IN2 may be used to control a voltage of an internal node, and the gate power voltage applied to the first power input terminal IN1 may be used to output the gate signal (or as the gate signal). That is, the gate power voltage for controlling the voltage of the internal node and the gate power voltage for generating the gate signal may be independently provided to each of the stages ST1, ST2, and STn. However, the disclosure is not limited thereto, and the first power input terminal IN1 and the second power input terminal IN2 may be integrated into one terminal, or the same gate power voltage may be applied to the first power input terminal IN1 and the second power input terminal IN2.

Each of the stages ST1, ST2, and STn may be connected to the start signal line STPL or the output terminal OUT of a previous stage, and may generate a gate signal in response to a start signal provided through the start signal line STPL or a previous gate signal of the previous stage.

For example, the input terminal IN0 of the first stage ST1 may be connected to the start signal line STPL. The first stage ST1 may generate a first gate signal in response to the start signal applied to the start signal line STPL (for example, the first gate signal in which the start signal is delayed by a half period of the clock signal). For example, the input terminal IN0 of the second stage ST2 may be connected to the output terminal OUT of the first stage ST1 (or the first gate line GL1). Similarly, the input terminal IN0 of the n-th stage STn may be connected to the output terminal of an (n-1)-th stage (or an (n-1)-th gate line GLn-1).

That is, the stages ST1, ST2, and STn may sequentially generate gate signals in response to the start signal or the previous gate signal of the previous stage.

Figure 5:
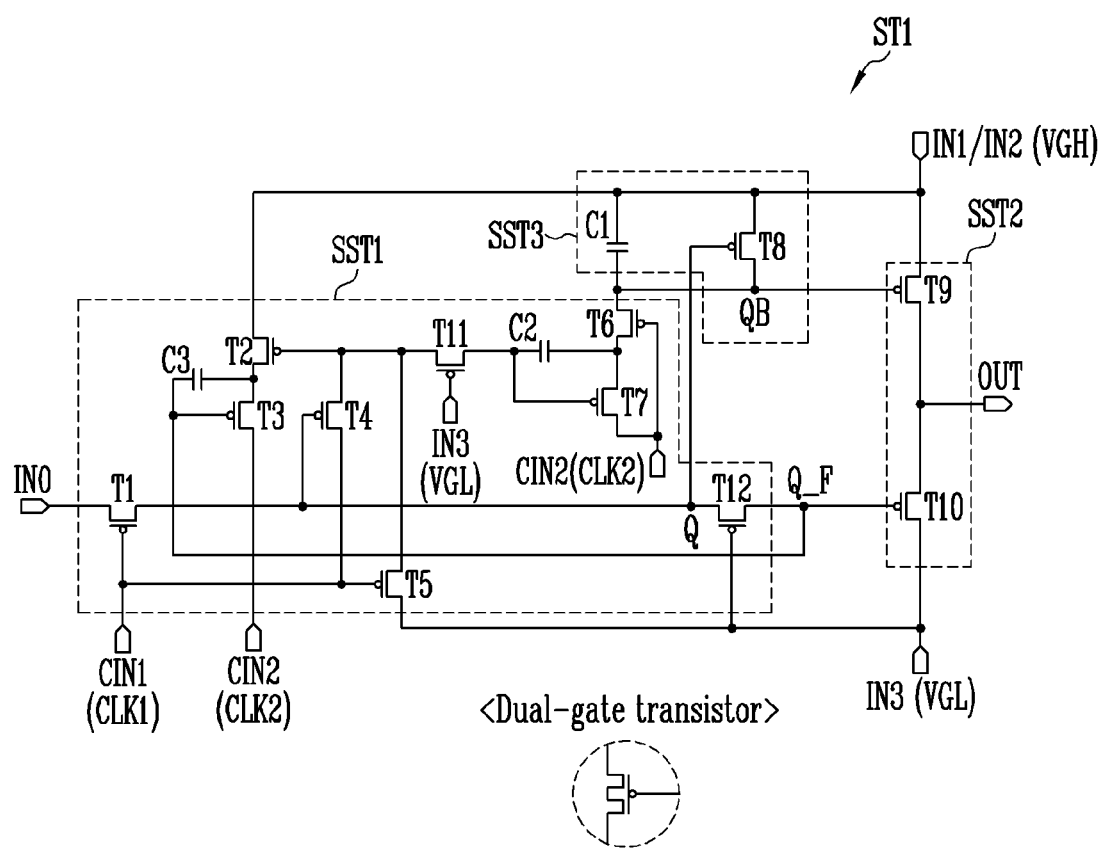
FIG. 5 is a circuit diagram illustrating an embodiment of a first stage included in the gate driver of FIG. 4.

FIG. 5 is a circuit diagram illustrating an embodiment of the first stage included in the gate driver of FIG. 4.

Referring to FIGS. 4 and 5, in the first stage ST1, the first power input terminal IN1 may be connected to the first gate power line VGHL1, the second power input terminal IN2 may be connected to the second gate power line VGHL2, the third power input terminal IN3 may be connected to the reference gate power line VGLL, the first clock input terminal CIN1 may be connected to the first clock signal line CLKL1, and the second clock input terminal CIN2 may be connected to the second clock signal line CLKL2. A gate power voltage VGH (or a high level voltage) may be applied to the first and second gate power lines VGHL1 and VGHL2 (and the first and second power input terminals IN1 and IN2), the reference gate power voltage VGL may be applied to the reference gate power line VGLL (and the third power input terminal IN3), the first clock signal CLK1 may be applied to the first clock signal line CLKL1 (and the first clock input terminal CIN1), and the second clock signal CLK2 may be applied to the second clock signal line CLKL2 (and the second clock input terminal CIN2). The input terminal IN0 may be connected to the start signal line STPL. For example, the gate power voltage VGH may have a value between about 4V and about 10V, and the reference gate power voltage VGL may have a value between about −4V and about −10V.

The first stage ST1 may include a node control circuit SST1, an output circuit SST2 (or a buffer circuit), and a node holding circuit SST3.

First, the output circuit SST2 may be connected between the first power input terminal IN1 and the third power input terminal IN3. The output circuit SST2 may output the gate power voltage VGH or the reference gate power voltage VGL to the output terminal OUT as a first gate signal depending on a voltage of a second control node Q_F and a voltage of a first control node QB.

The output circuit SST2 may include a ninth transistor T9 (or a pull-up transistor) and a tenth transistor T10 (or a pull-down transistor).

The ninth transistor T9 may include a first electrode connected to the first power input terminal IN1 (or the second power input terminal IN2), a second electrode connected to the output terminal OUT, and a gate electrode connected to the first control node QB.

The tenth transistor T10 may include a first electrode connected to the output terminal OUT, a second electrode connected to the third power input terminal IN3, and a gate electrode connected to the second control node Q_F.

The node control circuit SST1 may be connected to the input terminal IN0, the second power input terminal IN2 (or the first power input terminal IN1), the third power input terminal IN3, the first clock input terminal CIN1, and the second clock input terminal CIN2. The node control circuit SST1 may control a voltage of the first control node QB and the voltage of the second control node Q_F in response to the start signal (or the previous gate signal) and the gate power voltage VGH provided through the input terminal IN0.

The node control circuit SST1 may include first, second, third, fourth, fifth, sixth, seventh, eleventh, and twelfth transistors T1, T2, T3, T4, T5, T6, T7, T11, and T12, a second capacitor C2 (or a coupling capacitor), and a third capacitor C3.

The first transistor T1 may include a first electrode connected to the input terminal IN0, a second electrode connected to a third control node Q (or a first electrode of the twelfth transistor T12), and a gate electrode connected to the first clock input terminal CIN1.

The second transistor T2 may include a first electrode connected to the second power input terminal IN2 (or the first power input terminal IN1), a second electrode connected to a first electrode of the third transistor T3, and a gate electrode connected to a first electrode of the eleventh transistor T11.

The third transistor T3 may include the first electrode connected to the second electrode of the second transistor T2, a second electrode connected to the second clock input terminal CIN2, and a gate electrode connected to the second control node Q_F.

The third capacitor C3 may be formed between the second electrode of the second transistor T2 and the second control node Q_F, and may include a first electrode connected to the second electrode of the second transistor T2 and a second electrode connected to the second control node Q_F.

The fourth transistor T4 may include a first electrode connected to the gate electrode of the second transistor T2, a second electrode connected to the first clock input terminal CIN1, and a gate electrode connected to the third control node Q.

The fifth transistor T5 may include a first electrode connected to the gate electrode of the second transistor T2, a second electrode connected to the third power input terminal IN3, and a gate electrode connected to the first clock input terminal CIN1.

The sixth transistor T6 may include a first electrode connected to the first control node QB, a second electrode connected to a first electrode of the seventh transistor T7, and a gate electrode connected to the second clock input terminal CIN2.

The seventh transistor T7 may include the first electrode connected to the second electrode of the sixth transistor T6, a second electrode connected to the second clock input terminal CIN2, and a gate electrode connected to a second electrode of the eleventh transistor T11.

The second capacitor C2 (or a coupling capacitor) may be formed between the second electrode of the eleventh transistor T11 and the second electrode of the sixth transistor T6, and may include a first electrode connected to the second electrode of the eleventh transistor T11 and a second electrode connected to the second electrode of the sixth transistor T6.

The eleventh transistor T11 (or a first coupling transistor) may include a first electrode connected to the gate electrode of the second transistor T2, a second electrode connected to the first electrode of the second capacitor C2, and a gate electrode connected to the third power input terminal IN3.

The twelfth transistor T12 (or a second coupling transistor) may include a first electrode connected to the third control node Q (or the second electrode of the first transistor T1), a second electrode connected to the second control node Q_F, and a gate electrode connected to the third power input terminal IN3.

The node holding circuit SST3 may constantly maintain the voltage of the first control node QB in response to a voltage of the third control node Q. The node holding circuit SST3 may include a first capacitor C1 and an eighth transistor T8.

The first capacitor C1 may be formed between the first power input terminal IN1 (or the second power input terminal IN2) and the first control node QB, and may include a first electrode connected to the first power input terminal IN1 and a second electrode connected to the first control node QB. The first capacitor C1 may constantly maintain a voltage difference between the first power input terminal IN1 and the first control node QB.

The eighth transistor T8 may include a first electrode connected to the first power input terminal IN1, a second electrode connected to the first control node QB, and a gate electrode connected to the third control node Q. The eighth transistor T8 may constantly maintain the voltage of the first control node QB in response to the voltage of the third control node Q. For example, when the voltage of the third control node Q has a low level, the eighth transistor T8 may maintain the voltage of the first control node QB as a high level using the gate power voltage VGH.

Each of the first to twelfth transistors T1 to T12 may be a P-type transistor. In FIG. 5, the first to twelfth transistors T1 to T12 are single gate transistors, but the disclosure is not limited thereto. For example, in order to improve reliability, at least one of the first to twelfth transistors T1 to T12 may be implemented as a dual gate transistor (that is, a dual gate transistor configured of two transistors connected to each other in series and having gate electrodes connected to each other).

Figure 6:
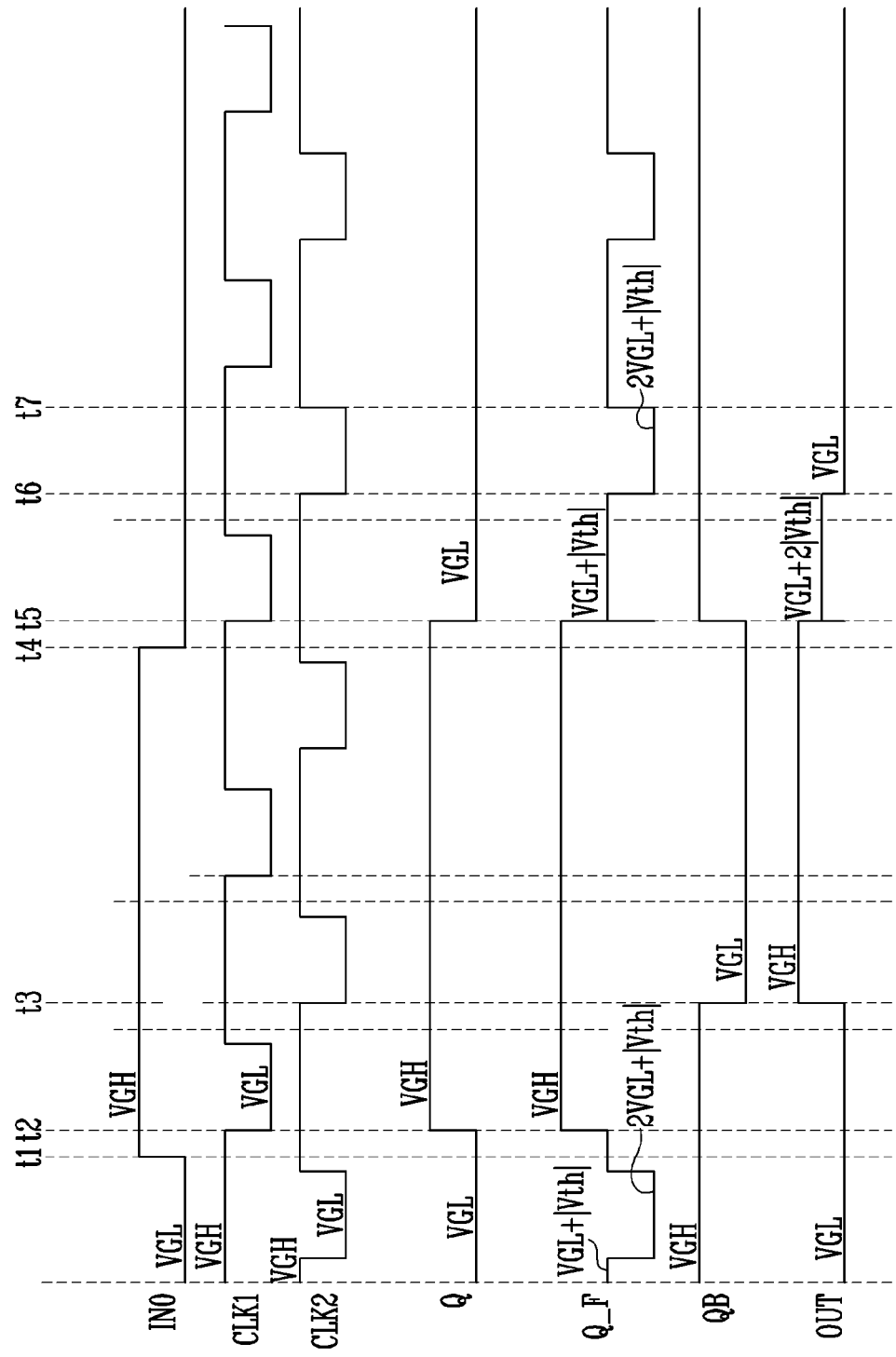
FIG. 6 is a waveform diagram illustrating an operation of the first stage of FIG. 5.

FIG. 6 is a waveform diagram illustrating an operation of the first stage of FIG. 5.

Referring to FIGS. 5 and 6, the first clock signal CLK1 applied to the first clock input terminal CIN1 may have a first low level and a high level in a specific period. Here, the first low level may correspond to a gate-on voltage level that turns on the P-type transistor (or a gate-off voltage level that turns off the N-type transistor), and may be the same as a voltage level of the reference gate power voltage VGL. The high level may correspond to a gate-off voltage level that turns off the P-type transistor (or a gate-on voltage that turns on the N-type transistor), and may be the same as a voltage level of the gate power voltage VGH. For example, the first clock signal CLK1 may have a first frequency.

The second clock signal CLK2 applied to the second clock input terminal CIN2 may have a waveform in which the first clock signal CLK1 is delayed by half period.

At a first time point t1, a voltage (for example, a start signal) of the input terminal IN0 may change from the first low level to the high level. For example, the voltage of the input terminal IN0 may be maintained as the high level for twice a period of the first clock signal CLK1.

At the first time point t1, the voltage of the third control node Q may have the first low level, the voltage of the second control node Q_F may have a second low level VGL+|Vth|, the voltage of the first control node QB may have the high level, and the voltage of the output terminal OUT (that is, the first gate signal) may have a low level. Here, the second low level VGL+|Vth| may have a voltage level similar to that of the first low level, and for example, the second low level VGL+|Vth| may have a voltage level higher than the reference gate power voltage VGL by a threshold voltage Vth of the transistor (for example, the twelfth transistor T12) (that is, VGL+|Vth|).

At a second time point t2, the first clock signal CLK1 may fall from the high level to the first low level.

In this case, the first transistor T1 may be turned on in response to the first clock signal CLK1 of the first low level, and the voltage of the input terminal IN0 (that is, the voltage of the high level) may be applied to the third control node Q. Accordingly, the voltage of the third control node Q may change to have the high level. Since the twelfth transistor T12 is turned on by the reference gate power voltage VGL, the voltage of the third control node Q may be applied to the second control node Q_F through the twelfth transistor T12. That is, the voltage of the second control node Q_F may change to have the high level.

In addition, in response to the first clock signal CLK1 of the first low level, the fifth transistor T5 may be turned on, and the reference gate power voltage VGL may be applied to the first electrode of the eleventh transistor T11. Since the eleventh transistor T11 is turned on by the reference gate power voltage VGL, the reference gate power voltage VGL may be applied to the first electrode of the second capacitor C2. The seventh transistor T7 may be turned on in response to the reference gate power voltage VGL (that is, the reference gate power voltage VGL applied to the first electrode of the second capacitor C2), and the second clock signal CLK2 of the high level may be applied to the second electrode of the second capacitor C2. Therefore, a voltage corresponding to a difference between the high level and the first low level may be charged in the second capacitor C2.

The second transistor T2 may be turned on in response to the reference gate power voltage VGL, and the gate power voltage VGH may be applied to the first electrode of the third capacitor C3. Since the second electrode of the third capacitor C3 is connected to the second control node Q_F and the voltage of the second control node Q_F has the high level, the third capacitor C3 may be discharged.

At a third time point t3, the second clock signal CLK2 may fall from the high level to the first low level.

In this case, the sixth transistor T6 may be turned on in response to the second clock signal CLK2 of the first low level. The second clock signal CLK2 of the first low level may be applied to the first control node QB through the seventh transistor T7 which is turned on by the second capacitor C2 and the sixth transistor T6 which is turned on. That is, the voltage of the first control node QB may change to have the first low level.

The ninth transistor T9 may be turned on in response to the voltage of the first control node QB (that is, the first low level), and the gate power voltage VGH may be applied to the output terminal OUT from the first power input terminal IN1 through the ninth transistor T9. That is, the voltage (that is, the gate signal) at the output terminal OUT may change to have the high level.

Thereafter, even though the first control node QB is in a floating state due to changes of the first clock signal CLK1 and the second clock signal CLK2, the voltage of the first control node QB may be maintained as the first low level by the first capacitor C1, and the voltage at the output terminal OUT (that is, the gate signal) may be maintained as the high level.

At a fourth time point t4, the voltage (for example, a start signal) of the input terminal IN0 may change from the high level to the first low level.

At a fifth time point t5, the first clock signal CLK1 may fall from the high level to the first low level.

In this case, the first transistor T1 may be turned on in response to the first clock signal CLK1 of the first low level, and the voltage of the input terminal IN0 (that is, the voltage of the first low level) may be applied to the third control node Q. Accordingly, the voltage of the third control node Q may change to have the first low level. Since the twelfth transistor T12 is turned on by the reference gate power voltage VGL, the voltage of the third control node Q may be applied to the second control node Q_F through the twelfth transistor T12. The voltage of the second control node Q_F may change to have the second low level VGL+|Vth| by the threshold voltage of the twelfth transistor T12.

The tenth transistor T10 may be turned on in response to the voltage of the second control node Q_F, and the reference gate power voltage VGL may be applied to the output terminal OUT. The voltage at the output terminal OUT may change to have a third low level VGL + 2|Vth| (that is, a voltage level higher than the second low level VGL+|Vth| by the absolute value of the threshold voltage of the transistor (e.g., the tenth transistor T10) by the voltage of the second control node Q_F and a threshold voltage of the tenth transistor T10.

Meanwhile, the fourth transistor T4 may be turned on by the voltage of the input terminal IN0 provided through the first transistor T1. In addition, in response to the first clock signal CLK1 of the first low level, the fifth transistor T5 may be turned on, and the reference gate power voltage VGL (and the first clock signal CLK1) may be applied to the gate electrode of the second transistor T2.

The second transistor T2 may be turned on in response to the reference gate power voltage VGL, and the gate power voltage VGH may be applied to the first electrode of the third capacitor C3. Since the second electrode of the third capacitor C3 is connected to the second control node Q_F, the second low level VGL+|Vth| of the second node voltage V_Q may be applied to the second electrode of the third capacitor C3. Since a voltage difference occurs between both ends of the third capacitor C3, the third capacitor C3 may be charged by the gate power voltage VGH provided through the second transistor T2.

Meanwhile, the eighth transistor T8 may be turned on by the voltage of the input terminal IN0, and the gate power voltage VGH may be applied to the first control node QB. That is, the first control node QB may change to have the high level.

At a sixth time point t6, the second clock signal CLK2 may fall from the high level to the first low level.

Since the third transistor T3 is turned on by the voltage of the second control node Q_F, the second clock signal CLK2 of the first low level may be applied to the first electrode of the third capacitor C3. The voltage of the second control node Q_F may be boosted by the third capacitor C3, and the voltage of the second control node Q_F may change to have a fourth low level 2VGL + |Vth|. In addition, the output terminal OUT may change to have the first low level in response to the voltage of the second control node Q_F. Here, the fourth low level 2VGL + |Vth| may have a voltage level lower than that of the first low level. For example, the fourth low level 2VGL +|Vth| may have a voltage level lower than the second low level VGL+|Vth| by the absolute value of the reference gate power voltage VGL.

At a seventh time point t7, the second clock signal CLK2 may rise from the first low level to the high level.

In this case, the second clock signal CLK2 of the high level may be applied to the first electrode of the third capacitor C3 through the third transistor T3. The voltage of the second control node Q_F may change to have the second low level VGL + |Vth| by the third capacitor C3.

As described with reference to FIGS. 5 and 6, the first stage ST1 may output the gate power voltage VGH as the first gate signal through the output terminal OUT in response to a waveform in which the voltage of the input terminal IN0 (for example, the start signal) is delayed by a half period of the second clock signal CLK2.

Figure 7:
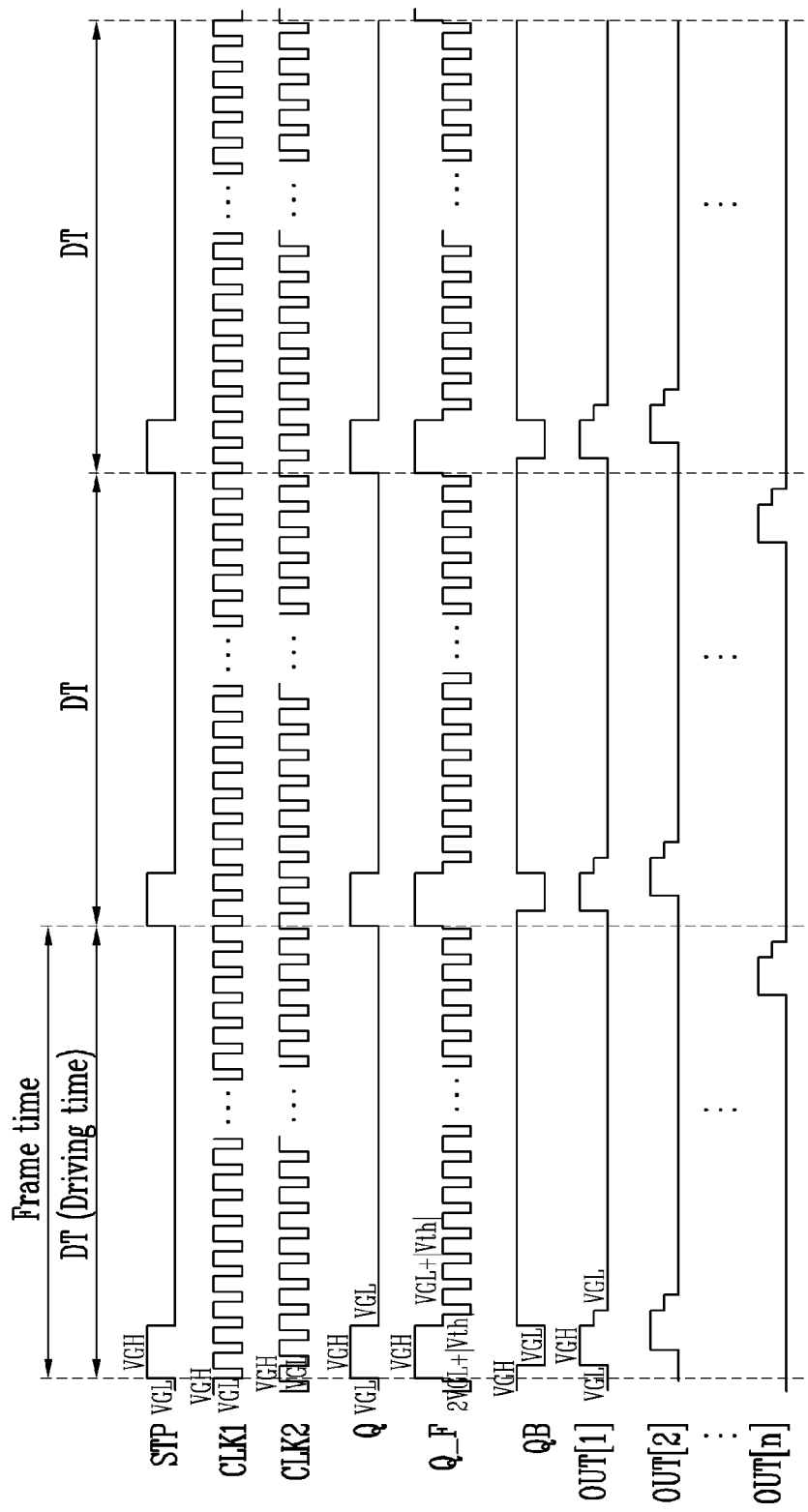
FIG. 7 is a diagram illustrating an operation of the gate driver of FIG. 4 in a first mode.
Figure 8:
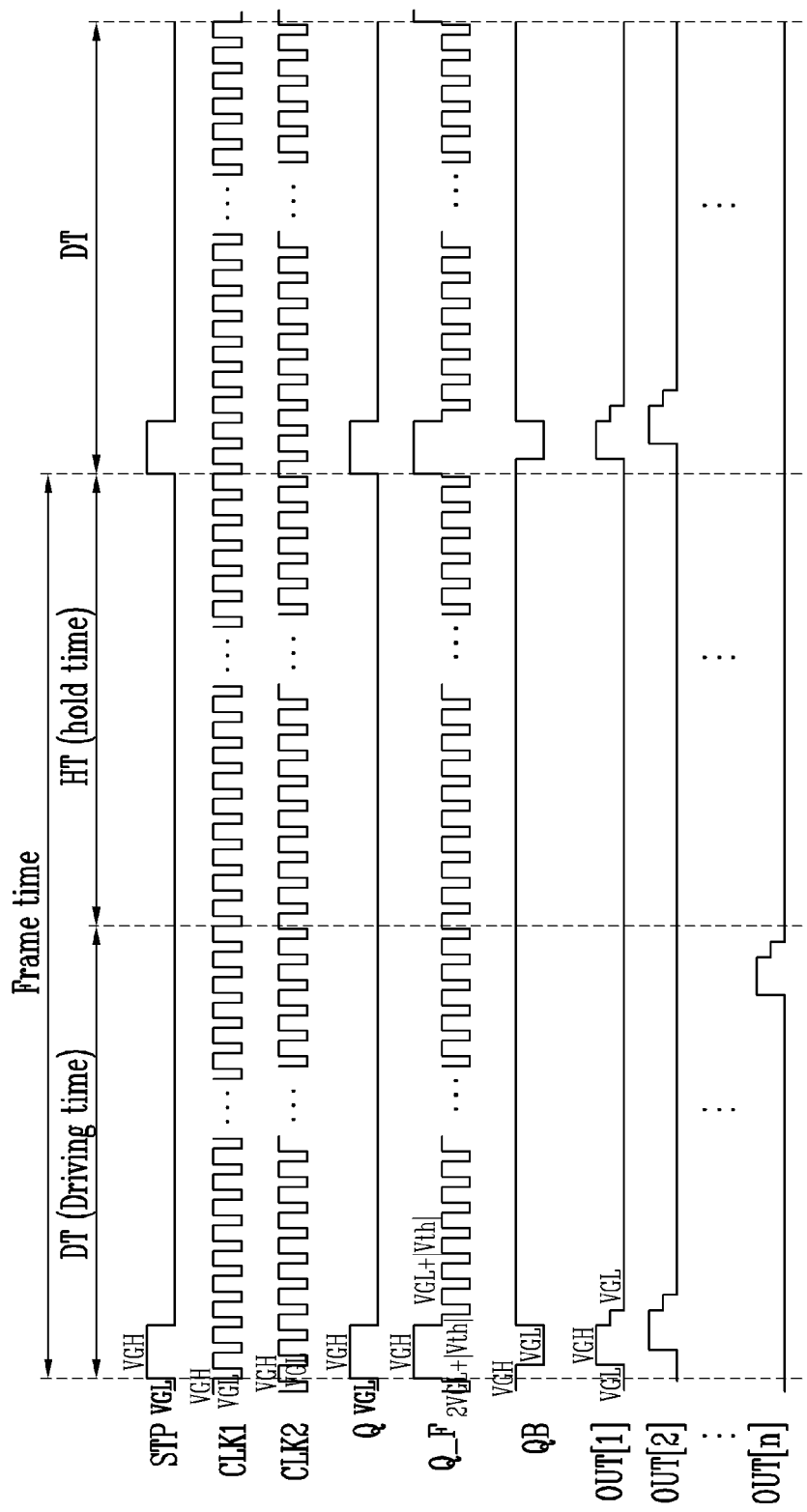
FIGS. 8 and 9 are diagrams illustrating a comparative embodiment of the operation of the gate driver of FIG. 4 in a second mode.
Figure 9:
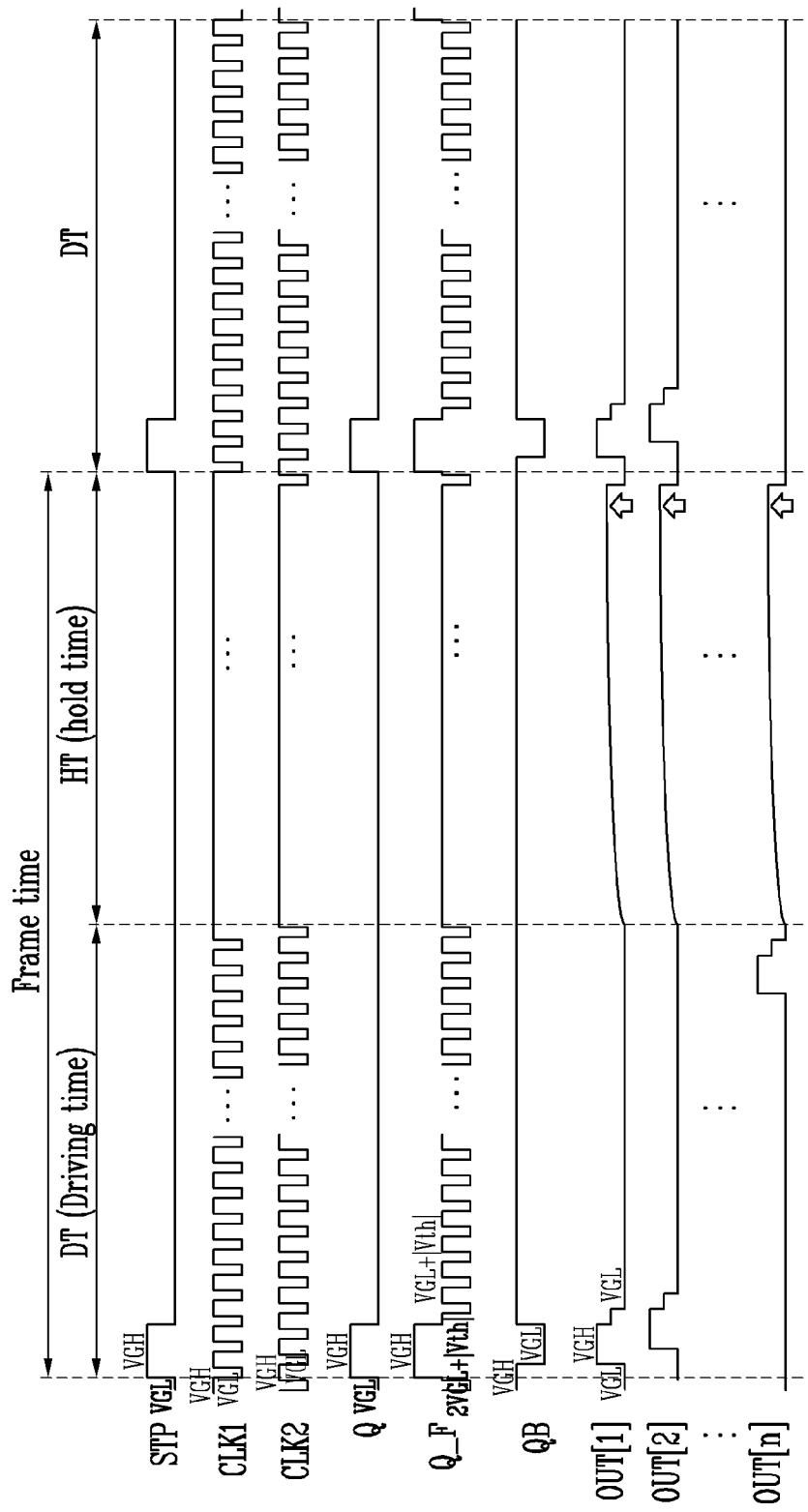

FIG. 7 is a diagram illustrating an operation of the gate driver of FIG. 4 in a first mode. FIGS. 8 and 9 are diagrams illustrating a comparative embodiment of the operation of the gate driver of FIG. 4 in a second mode.

First, referring to FIGS. 4 to 7, the gate driver GDV or the display device DD (refer to FIG. 1) may be driven in the first mode or the second mode. For example, the first mode and the second mode may have different driving frequencies of the gate driver GDV. Here, the driving frequency may be a frequency at which the gate signal is output during a specific time. The driving frequency may correspond to a scan rate or a screen refresh rate of the display device DD. For example, the display device DD may display an image in response to various driving frequencies of 1 Hz to 120 Hz, the gate driver GDV may operate at a maximum driving frequency (for example, 120 Hz) in the first mode and may operate at a frequency lower than the maximum driving frequency (for example, 60 Hz, 30 Hz, or 1 Hz) in the second mode.

One frame time may include one driving time DT. In the one driving time DT, the gate driver GDV may output the gate signals (for example, gate signals of the high level). In the first mode, the one frame time may be the same as the one driving time DT.

The start signal STP may be provided to the start signal line STPL, and may be substantially the same as a signal at the input terminal IN0 of FIG. 6. Since the voltages at the first clock signal CLK1, the second clock signal CLK2, the third control node Q, the second control node Q_F, and the first control node QB are described with reference to FIG. 6, an overlapping description is not be repeated. A first output voltage OUT[1] may be the same as the voltage at the output terminal OUT of FIG. 6. A second output voltage OUT[2] may be the voltage at the output terminal OUT of the second stage ST2 of FIG. 4, and the second output voltage OUT[2] may have a waveform in which the first output voltage OUT[1] is shifted by a half period of the first clock signal CLK1 according to an operation of the second stage ST2. Similarly, an n-th output voltage OUT[n] may be a voltage at the output terminal OUT of the n-th stage STn of FIG. 4, and the n-th output voltage OUT[n] may have a waveform in which the first output voltage OUT[1] is shifted by a specific time according to an operation of the n-th stage STn.

As shown in FIG. 7, in the first mode, the gate driver GDV may sequentially output the gate signals corresponding to the output voltages OUT[1], OUT[2], and OUT[n] in every driving time DT (for example, about 8.3 ms).

Referring to FIGS. 8 and 9, one frame time may include one driving time DT (for example, a first period) and one hold time HT (for example, a second period). In the hold time HT, the gate driver GDV may not output the gate signals (for example, the gate signals of the high level). The gate driver GDV may be driven at various frequencies by changing the number or a time width of the hold times HT included in one frame time.

As shown in FIGS. 8 and 9, in the hold time HT, the start signal STP may be maintained as the low level. That is, the start signal STP of the high level may not be provided to the gate driver GDV in the hold time HT. In the hold time HT, the output voltages OUT[1], OUT[2], and OUT[n] may have the low level in response to the start signal STP of the low level.

As shown in FIG. 8, the first and second clock signals CLK1 and CLK2 may have a first frequency and may be toggled between the high level and the low level. The first, second, and third capacitors C1, C2, and C3 (refer to FIG. 5) in the stages ST1, ST2, and STn may be charged and discharged by a rising and a falling of the first and second clock signals CLK1 and CLK2, and thus power consumption may become high. In the hold time HT, power may be consumed by the rising and the falling of the first and second clock signals CLK1 and CLK2 even though the gate driver GDV does not output the gate signals of the high level.

Therefore, in order to reduce power consumption in the hold time HT, the first and second clock signals CLK1 and CLK2 may have a second frequency lower than the first frequency in the hold time HT. For example, the first and second clock signals CLK1 and CLK2 may have a frequency substantially close to 0 during the hold time HT.

As shown in FIG. 9, in the hold time HT, the first and second clock signals CLK1 and CLK2 may be maintained as the high level. This is because when the first and second clock signals CLK1 and CLK2 are maintained as the low level, the first control node QB is maintained as the low level by the sixth and seventh transistors T6 and T7 of FIG. 5, the ninth transistor T9 is turned on, and thus the gate power voltage VGH of the high level is transferred to the output terminal OUT. That is, when the first and second clock signals CLK1 and CLK2 are maintained as the low level, the gate signals may be output. Therefore, the first and second clock signals CLK1 and CLK2 may be maintained as the high level so that the gate signals are not output in the hold time HT.

Meanwhile, when the first and second clock signals CLK1 and CLK2 are maintained as the high level in the hold time HT, the voltage of the second control node Q_F may be maintained as the second low level VGL+|Vth| not the first low level (that is, VGL) (refer to the seventh time point t7 of FIG. 6), and the tenth transistor T10 of FIG. 5 may not completely maintain a turn-on state. In addition, as leakage occurs through the ninth transistor T9 of FIG. 5 in the hold time HT, the voltage of the output terminal OUT may increase. As shown in FIG. 9, the output voltages OUT[1], OUT[2], and OUT[n] may gradually increase during the hold time HT. Thereafter, at an end of the hold time HT, the output voltages OUT[1], OUT[2], and OUT[n] may change to the low level again by the second clock signal CLK2 of the second low level VGL+|Vth| (refer to the sixth time point t6 of FIG. 6). Flicker may occur in the display device DD due to the change of the output voltages OUT[1], OUT[2], and OUT[n] in the hold time HT.

Figure 10:
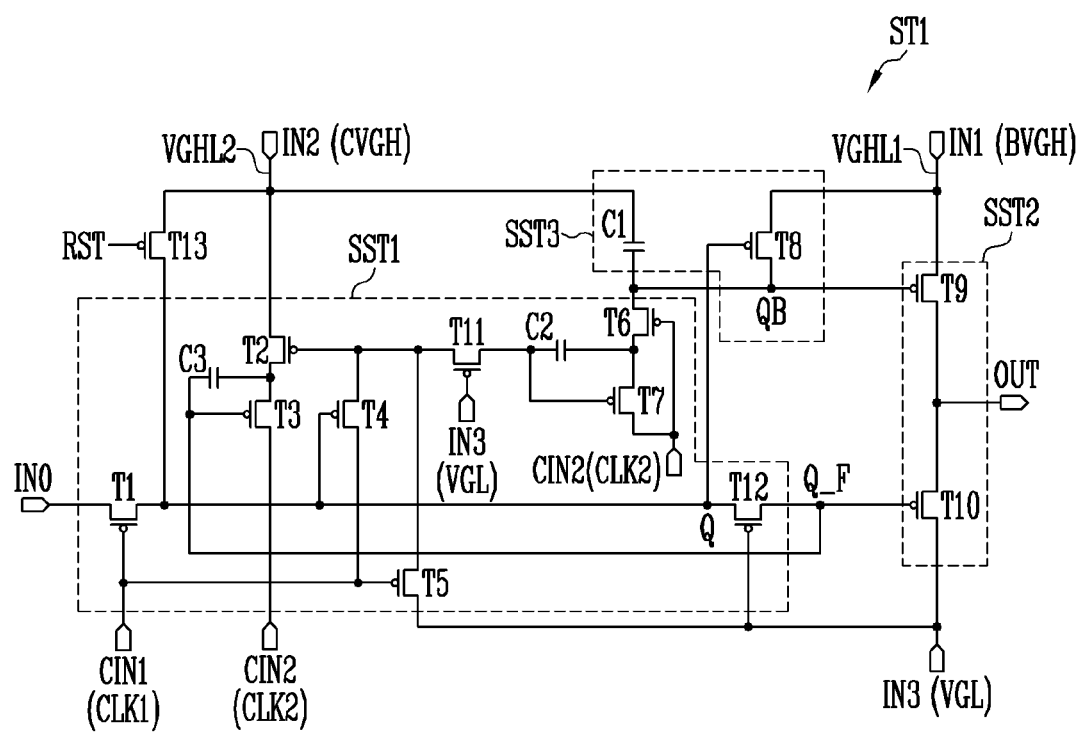
FIG. 10 is a circuit diagram illustrating another embodiment of the first stage included in the gate driver of FIG. 4.

FIG. 10 is a circuit diagram illustrating another embodiment of the first stage included in the gate driver of FIG. 4.

Referring to FIGS. 4, 5, and 10, the first stage ST1 of FIG. 10 may be substantially the same as or similar to the first stage ST1 of FIG. 5 except that the first power input terminal IN1 and the second power input terminal IN2 are separated. Therefore, an overlapping description is not be repeated.

The first power input terminal IN1 may be connected to the first gate power line VGHL1, and the second power input terminal IN2 may be connected to the second gate power line VGHL2. A first gate power voltage BVGH may be applied to the first gate power line VGHL1 (and the first power input terminal IN1), and a second gate power voltage CVGH may be applied the second gate power line VGHL2 (and the second power input terminal IN2). As will be described later with reference to FIGS. 11 to 13, the first gate power voltage BVGH and the second gate power voltage CVGH may have the high level in the driving time DT and generally may have the low level in the hold time HT.

A node control circuit SST1 and a node holding circuit SST3 controlling/maintaining the voltages of the first and second control nodes QB and Q_F may be connected to the second power input terminal IN2, and an output circuit SST2 outputting a signal in response to the voltages of the first and second control nodes QB and Q_F may be connected to the first power input terminal IN1.

In the node control circuit SST1, the first electrode of the second transistor T2 may be connected to the second power input terminal IN2.

In the node holding circuit SST3, the first electrode of the eighth transistor T8 may be connected to the first power input terminal IN1. The first capacitor C1 may be formed between the second power input terminal IN2 and the first control node QB, and may include the first electrode connected to the second power input terminal IN2 and the second electrode connected to the first control node QB.

In the output circuit SST2, the first electrode of the ninth transistor T9 may be connected to the first power input terminal IN1.

In an embodiment, the first stage ST1 may further include a thirteenth transistor T13. The thirteenth transistor T13 may be included in the node holding circuit SST3 or the node control circuit SST1.

The thirteenth transistor T13 (or a reset transistor) may include a first electrode connected to the second power input terminal IN2, a second electrode connected to the third control node Q (or the second electrode of the first transistor T1), and a gate electrode connected to the reset terminal RST. Here, the reset terminal RST may be connected to the reset signal line RSTL (refer to FIG. 4). When the display device DD (refer to FIG. 1) is turned on or turned off, a reset signal of the low level may be applied to the reset terminal RST, the thirteenth transistor T13 may be turned on in response to the reset signal of the low level, and may perform a reset operation so that the voltage at the second electrode of the first transistor T1 (and the third control node Q) has the second gate power voltage CVGH (for example, the high level).

The thirteenth transistor T13 may be a P-type transistor. The thirteenth transistor T13 may be implemented as a single gate transistor or a dual gate transistor as described with reference to FIG. 5.

Figure 11:
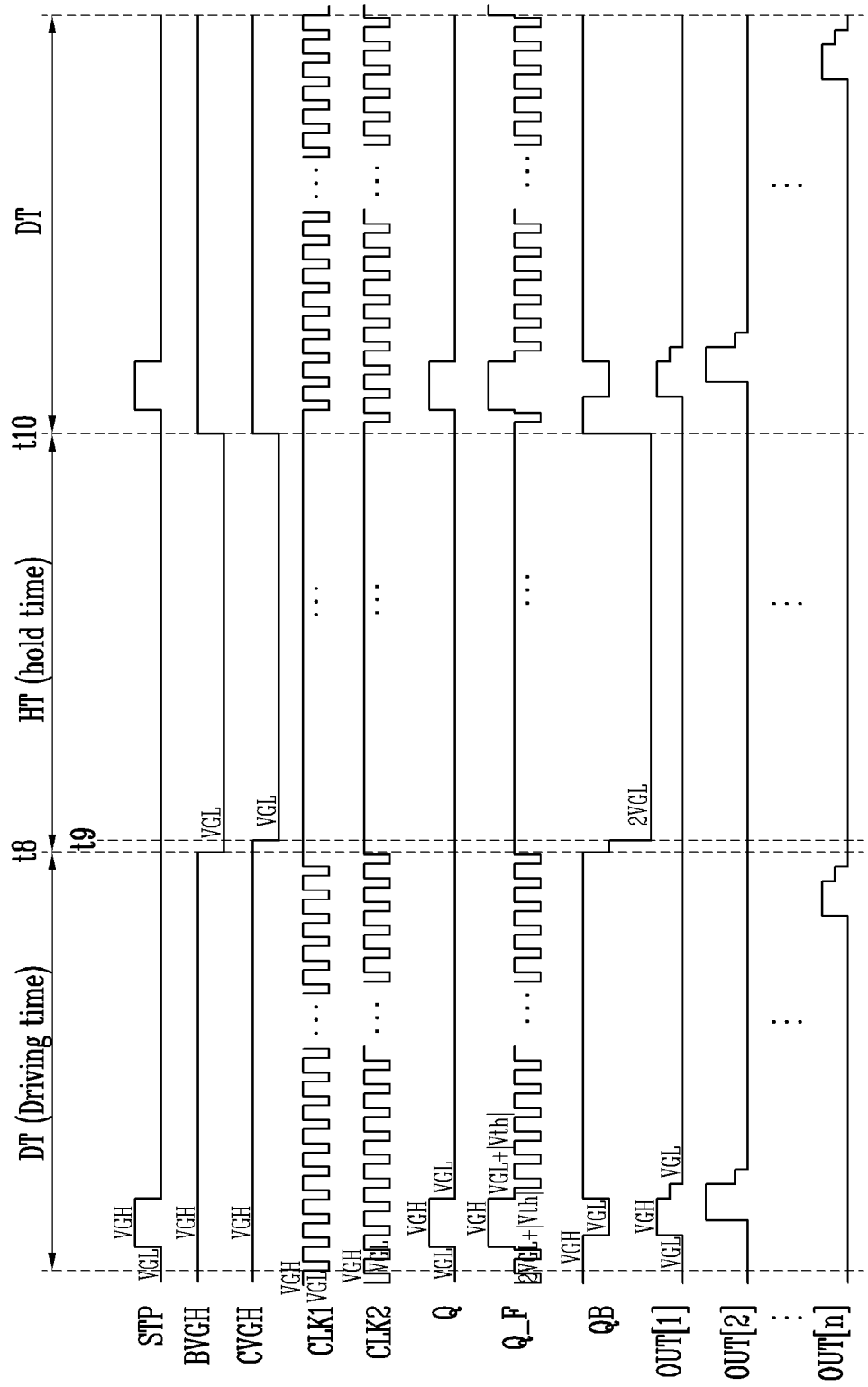
FIG. 11 is a diagram illustrating an embodiment of the operation of the gate driver of FIG. 4 in the second mode.

FIG. 11 is a diagram illustrating an embodiment of the operation of the gate driver of FIG. 4 in the second mode.

The embodiment of FIG. 11 may be applied to the gate driver GDV including the first stage ST1 of FIG. 10.

Referring to FIGS. 4, 9, 10, and 11, since the embodiment of FIG. 11 is substantially the same as or similar to the embodiment of FIG. 9 except for the first and second gate power voltages BVGH and CVGH and the voltage of the first control node QB, an overlapping description is not be repeated.

In the driving time DT, the first and second gate power voltages BVGH and CVGH may have the high level (for example, gate power voltage VGH). In this case, the first stage ST1 of FIG. 10 may operate identically to the first stage ST1 of FIG. 5. That is, in the driving time DT, the gate driver GDV including the first stage ST1 of FIG. 10 may sequentially output the gate signals (or the output voltages OUT[1], OUT[2], and OUT[n]).

At an eighth time point t8, the first clock signal CLK1 and the second clock signal CLK2 may be maintained as the high level. The eighth time point t8 may be a start time point of the hold time HT. A state of the first stage ST1 of FIG. 10 at the eighth time point t8 may be substantially the same as or similar to the state of the first stage ST1 at a seventh time point t7 of FIG. 6.

At the eighth time point t8 (or immediately after the eighth time point t8), the first gate power voltage BVGH may fall from the high level (for example, gate power voltage VGH) to the first low level (for example, reference gate power voltage VGL).

In this case, the first gate power voltage BVGH of the first low level may be applied to the first control node QB through the turned-on eighth transistor T8, and the voltage of the first control node QB may have the first low level. In addition, the ninth transistor T9 may be turned on in response to the voltage of the first control node QB, and the first gate power voltage BVGH of the first low level may be transferred to the output terminal OUT. Therefore, the first output voltage OUT[1] may be maintained as the first low level.

Meanwhile, at the eighth time point t8, a voltage difference between the second gate power voltage CVGH (for example, gate power voltage VGH) and the voltage of the first control node QB (for example, reference gate power voltage VGL) may be charged in the first capacitor C1.

Thereafter, at a ninth time point t9, the second gate power voltage CVGH may fall from the high level (for example, gate power voltage VGH) to the first low level (for example, reference gate power voltage VGL).

In this case, the voltage of the first control node QB may be boosted by the first capacitor C1, and the voltage of the first control node QB may be changed to a fifth low level 2VGL (i.e., twice of the reference gate power voltage VGL). In response to the voltage of the first control node QB, the ninth transistor T9 may maintain a turn-on state, the first gate power voltage BVGH of the first low level may be transferred to the output terminal OUT, and the first output voltage OUT[1] may be maintained as the first low level. During the hold time HT, since the first control node QB is maintained as the fifth low level 2VGL by the second gate power voltage CVGH and the first capacitor C1, the first output voltage OUT[1] may be maintained as the first low level substantially without change. Similarly, the second output voltage OUT[2] to the n-th output voltage OUT[n] may also be maintained as the first low level during the hold time HT.

Meanwhile, at a tenth time point t10, the first and second gate power voltages BVGH and CVGH may rise from the first low level to the high level. The tenth time point t10 may be an end time point of the hold time HT.

In this case, the first gate power voltage BVGH of the high level may be applied to the first control node QB through the turned-on eighth transistor T8, and the voltage of the first control node QB may have the high level. The ninth transistor T9 may be turned off in response to the voltage of the first control node QB. Since both of the ninth transistor T9 and the tenth transistor T10 are turned off, the first output voltage OUT[1] may not be changed and may be maintained as the first low level. Similarly, at the tenth time point t10, the second output voltage OUT[2] to the n-th output voltage OUT[n] may not be changed.

As described above, by maintaining the first gate power voltage BVGH as the first low level during the hold time HT, the gate signals (or the output voltages OUT[1], OUT[2], and OUT[n]) may be prevented from changing. In addition, by sequentially transiting the first gate power voltage BVGH and the second gate power voltage CVGH from the high level to the first low level in the hold time HT, the voltage of the first control node QB may be maintained as the fifth low level 2VGL, ninth transistor T9 may more stably maintain a turn-on state during the hold time HT, and the first output voltage OUT[1]and the second output voltage OUT[2] to the n-th output voltage OUT[n]) may be more effectively prevented from changing.

Meanwhile, in FIG. 11, the first gate power voltage BVGH and the second gate power voltage CVGH are sequentially transited from the high level to the first low level, but the disclosure is not limited thereto. For example, the first and second gate power voltages BVGH and CVGH may be simultaneously transited from the high level to the first low level. In this case, the embodiment of FIG. 11 may also be applied to the first stage ST1 of FIG. 5. An embodiment in which the first and second gate power voltages BVGH and CVGH are simultaneously transitioned is described later with reference to FIG. 13.

Figure 12:
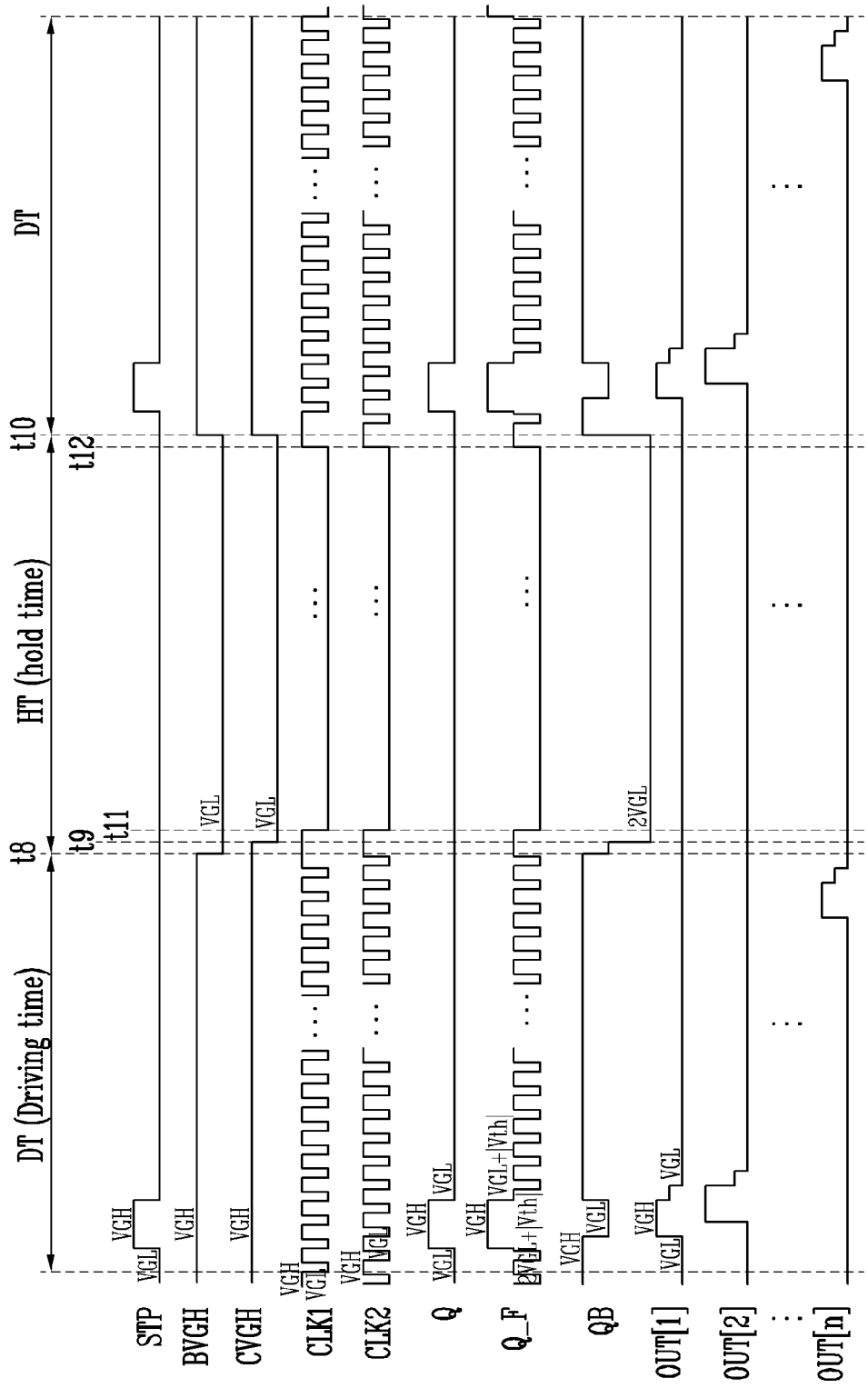
FIGS. 12 and 13 are diagrams illustrating another embodiment of the operation of the gate driver of FIG. 4 in the second mode.
Figure 13:
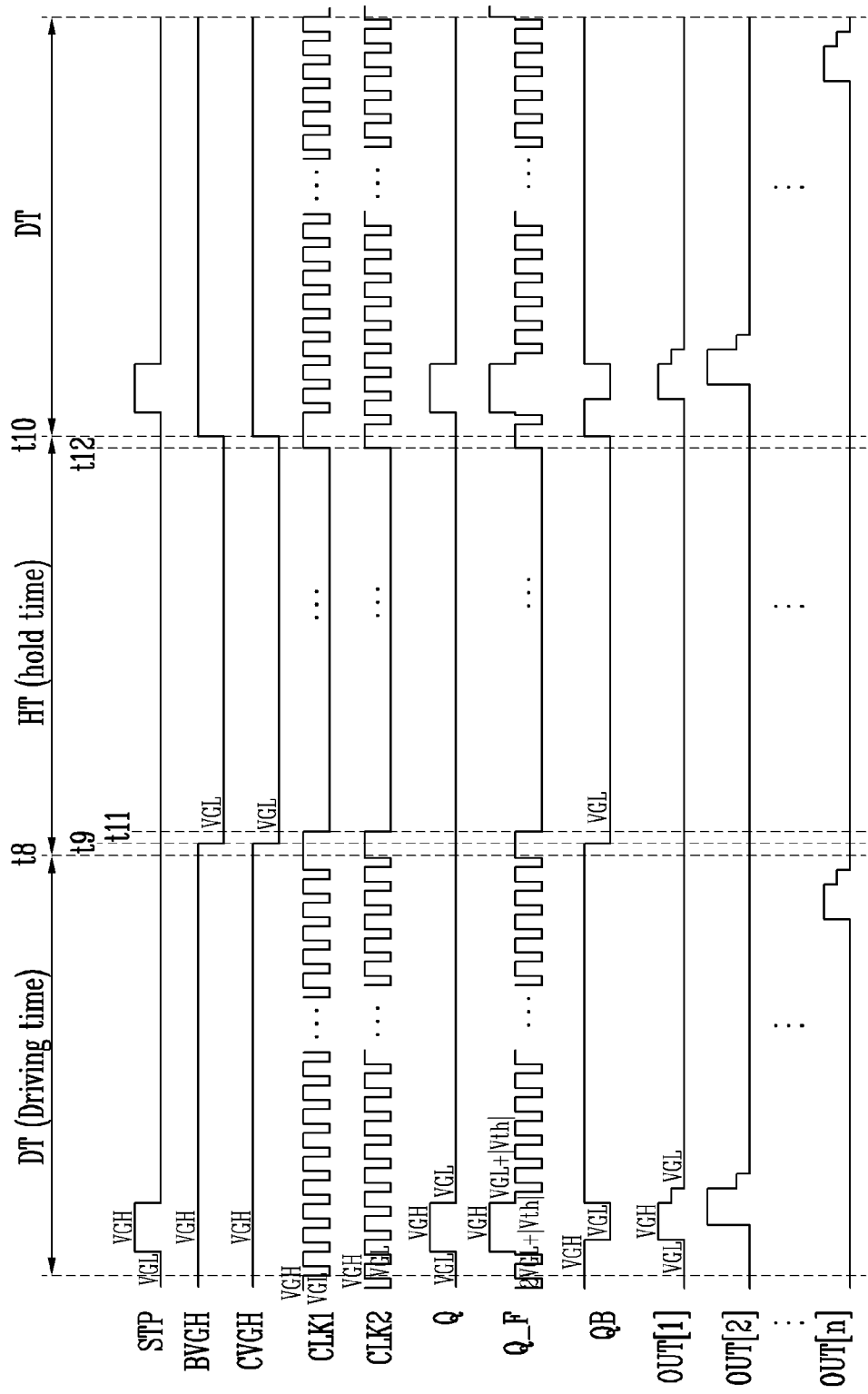

FIGS. 12 and 13 are diagrams illustrating another embodiment of the operation of the gate driver of FIG. 4 in the second mode.

First, referring to FIGS. 4 and 10 to 12, since the embodiment of FIG. 12 is substantially the same as or similar to the embodiment of FIG. 11 except for the first and second clock signals CLK1 and CLK2, an overlapping description is not be repeated.

At an eleventh time point t11, the first and second clock signals CLK1 and CLK2 may fall from the high level to the first low level.

In this case, similar to the sixth time point t6 of FIG. 6, the voltage of the second control node Q_F may be boosted by the third capacitor C3, and the voltage of the second control node Q_F may change to have the fourth low level 2VGL+|Vth|. In response to the voltage of the second control node Q_F, the tenth transistor T10 may maintain a turn-on state, the reference gate power voltage VGL of the first low level may be transferred to the output terminal OUT, and the first output voltage OUT[1] may be maintained as the first low level. During the hold time HT, the second control node Q_F is maintained as the fourth low level 2VGL+|Vth| by the second clock signal CLK2 of the first low level and the third capacitor C3, and thus the first output voltage OUT[1] may be maintained as the first low level without substantially changing. Since the first control node QB is also maintained as the fifth low level 2VGL, the first output voltage OUT[1] may be more robustly held as the first low level during the hold time HT.

Similarly, the second output voltage OUT[2] to the n-th output voltage OUT[n] may also be more robustly maintained as the first low level during the hold time HT.

Meanwhile, the eleventh time point t11 may be later than the eighth time point t8 and the ninth time point t9. That is, in a state in which the first and second gate power voltages BVGH and CVGH are at the first low level, the first and second clock signals CLK1 and CLK2 may fall from the high level to the first low level. This is because the gate signals of the high level may be output when the first and second clock signals CLK1 and CLK2 fall to the first low level in a state in which the first and second gate power voltages BVGH and CVGH are at the high level as described with reference to FIG. 9.

At a twelfth time point t12, the first and second clock signals CLK1 and CLK2 may rise from the first low level to the high level. The twelfth time point t12 may be earlier than the tenth time point t10. That is, after the first and second clock signals CLK1 and CLK2 rise from the first low level (for example, reference power voltage VGL) to the high level (for example, gate power voltage VGH), the first and second gate power voltages BVGH and CVGH may rise from the first low level (for example, reference gate power voltage VGL) to the high level (for example, gate power voltage VGH).

As the first and second clock signals CLK1 and CLK2 rise to the high level (for example, gate power voltage VGH) at the twelfth time point t12, the first control node QB and the second control node Q_F may return to a state before the eleventh time point t11. For example, the voltages of the first and second control nodes QB and Q_F at the twelfth time point t12 may become equal to the voltages of the first and second control nodes QB and Q_F at the ninth time point t9.

Meanwhile, in FIG. 12, the first gate power voltage BVGH and the second gate power voltage CVGH sequentially fall from the (for example, gate power voltage VGH) to the first low level (for example, reference gate power voltage VGL), but the disclosure is not limited thereto.

In an embodiment, in the hold time HT, the first and second gate power voltages BVGH and CVGH may simultaneously fall from the high level (for example, gate power voltage VGH) to the first low level (for example, reference gate power voltage VGL).

Referring to FIG. 13, at the ninth time point t9, the first and second gate power voltages BVGH and CVGH may fall from the high level (for example, gate power voltage VGH) to the first low level (for example, reference gate power voltage VGL).

In this case, the first gate power voltage BVGH of the first low level may be applied to the first control node QB through the turned-on eighth transistor T8, and the voltage of the first control node QB may have the first low level. In addition, the ninth transistor T9 may be turned on in response to the voltage of the first control node QB, and the first gate power voltage BVGH of the first low level may be transferred to the output terminal OUT. Therefore, the first output voltage OUT[1] may be maintained as the first low level.

Meanwhile, since the first and second gate power voltages BVGH and CVGH are simultaneously transited from the high level to the first low level, an additional voltage may not be charged in the first capacitor C1. That is, a boosting operation by the first capacitor C1 may not occur, and the voltage of the first control node QB may be maintained as the first low level during the hold time HT.

Since the first control node QB is maintained as the first low level during the hold time HT, the first output voltage OUT[1] may be maintained as the first low level by the first gate power voltage BVGH. Similarly, the second output voltage OUT[2] to the n-th output voltage OUT[n] may also be maintained as the first low level during the hold time HT.

As described above, by varying and maintaining the first and second clock signals CLK1 and CLK2 as the first low level in the hold time HT, the first output voltage OUT[1] and the second output voltage OUT[2] to the n-th output voltage OUT[n] may be more robustly held as the first low level state.

Meanwhile, since the first and second gate power voltages BVGH and CVGH simultaneously fall from the high level to the first low level in FIG. 13, the embodiment of FIG. 13 may also be applied to the first stage ST1 of FIG. 5.

FIGS. 14 to 17 are circuit diagrams illustrating various embodiments of the first stage included in the gate driver of FIG. 4.

Figure 14:
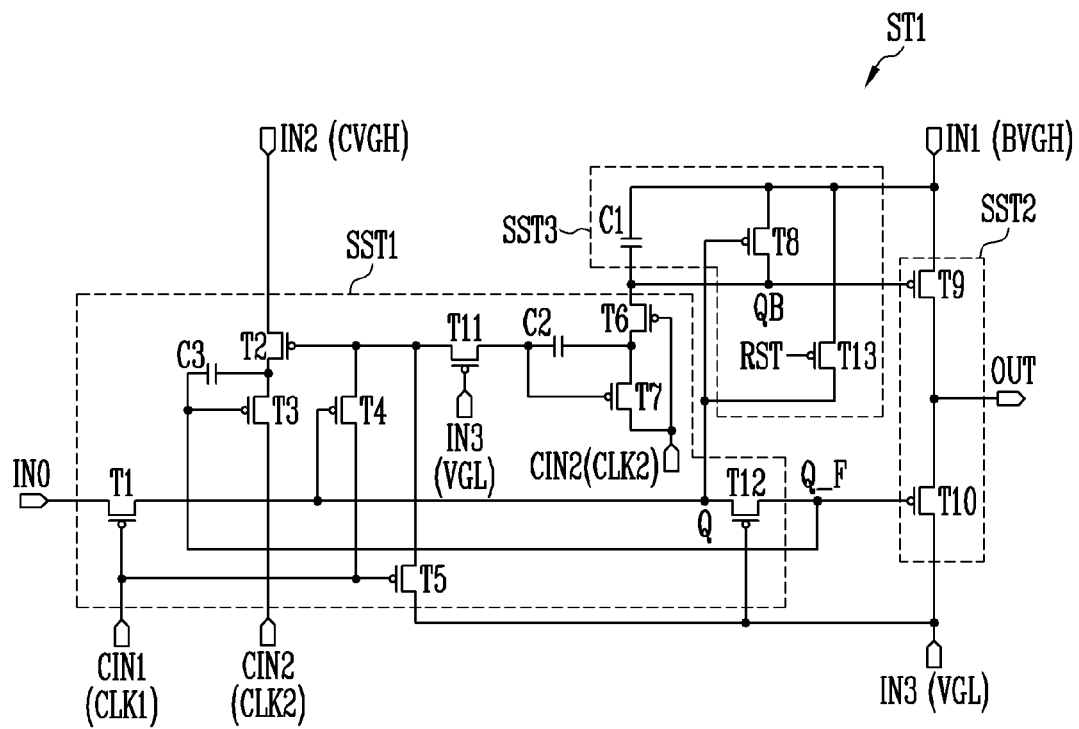
FIGS. 14, 15, 16 and 17 are circuit diagrams illustrating various embodiments of the first stage included in the gate driver of FIG. 4.
Figure 15:
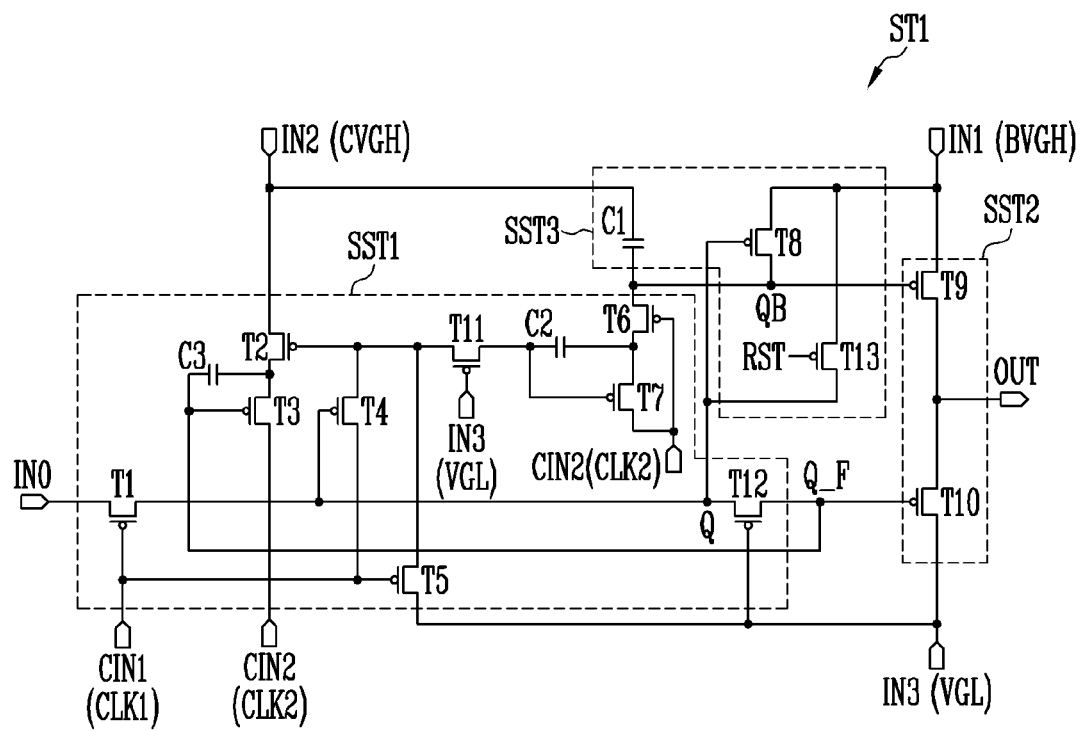

First, referring to FIGS. 4, 10, 14, and 15, the first stage ST1 of FIGS. 14 and 15 may be substantially the same as or similar to the first stage ST1 of FIG. 10 except for a connection configuration of the first capacitor C1 and the thirteenth transistor T13. Therefore, an overlapping description is not be repeated.

As shown in FIG. 14, the first capacitor C1 may be formed between the first power input terminal IN1 and the first control node QB. The first electrode of the first capacitor C1 may be connected to the first power input terminal IN1 and the second electrode of the first capacitor C1 may be connected to the first control node QB. In this case, even though the first and second gate power voltages BVGH and CVGH sequentially fall from the high level to the first low level, the boosting operation by the first capacitor C1 may not occur. Therefore, the gate driver GDV including the first stage ST1 of FIG. 14 may operate according to the embodiment of FIG. 11 or the embodiment of FIG. 12. However, the disclosure is not limited thereto, and for example, the gate driver GDV including the first stage ST1 of FIG. 14 may operate according to the embodiment of FIG. 13.

In an embodiment, the thirteenth transistor T13 may include a first electrode connected to the first power input terminal IN1, a second electrode connected to the third control node Q, and a gate electrode connected to the reset terminal RST. That is, compared to FIG. 10, the first electrode of the thirteenth transistor T13 may be connected to the first power input terminal IN1 instead of the second power input terminal IN2.

As shown in FIG. 15, the first capacitor C1 may be formed between the second power input terminal IN2 and the first control node QB. The first electrode of the first capacitor C1 may be connected to the second power input terminal IN2 and the second electrode of the first capacitor C1 may be connected to the first control node QB. When the first and second gate power voltages BVGH and CVGH sequentially fall from the high level to the first low level, the voltage of the first control node QB may be boosted by the first capacitor C1. Therefore, the gate driver GDV including the first stage ST1 of FIG. 15 may operate according to the embodiment of FIG. 13. However, the disclosure is not limited thereto, and for example, the gate driver GDV including the first stage ST1 of FIG. 15 may operate according to the embodiment of FIG. 11 or the embodiment of FIG. 12.

Figure 16:
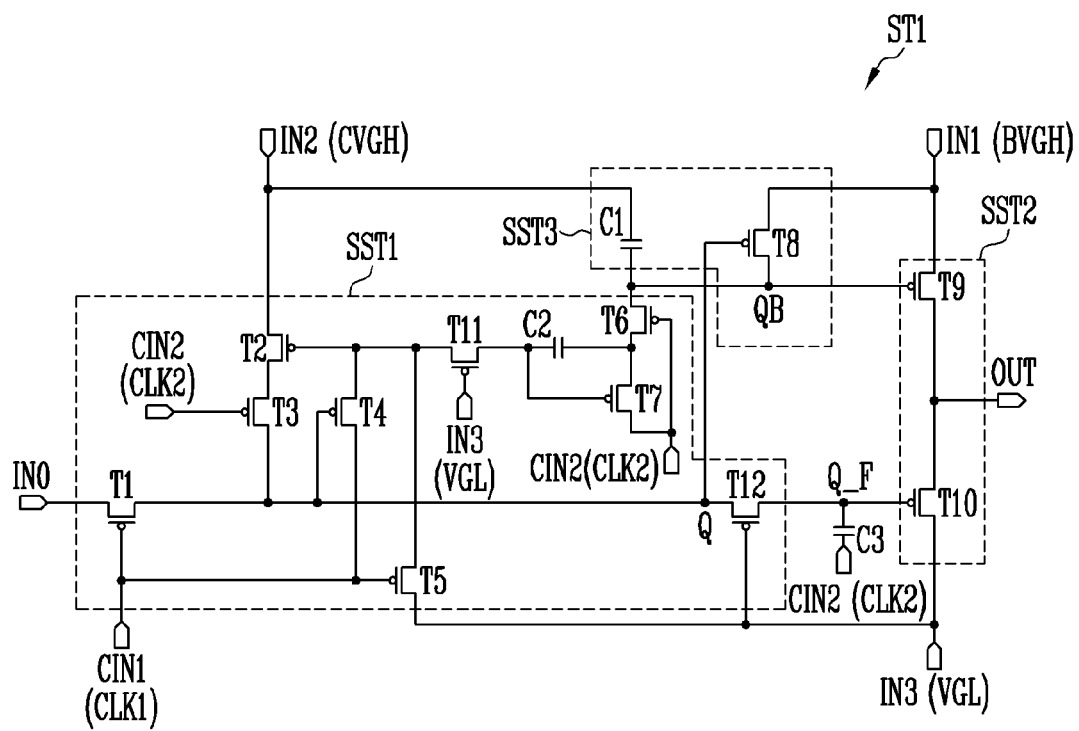
Figure 17:
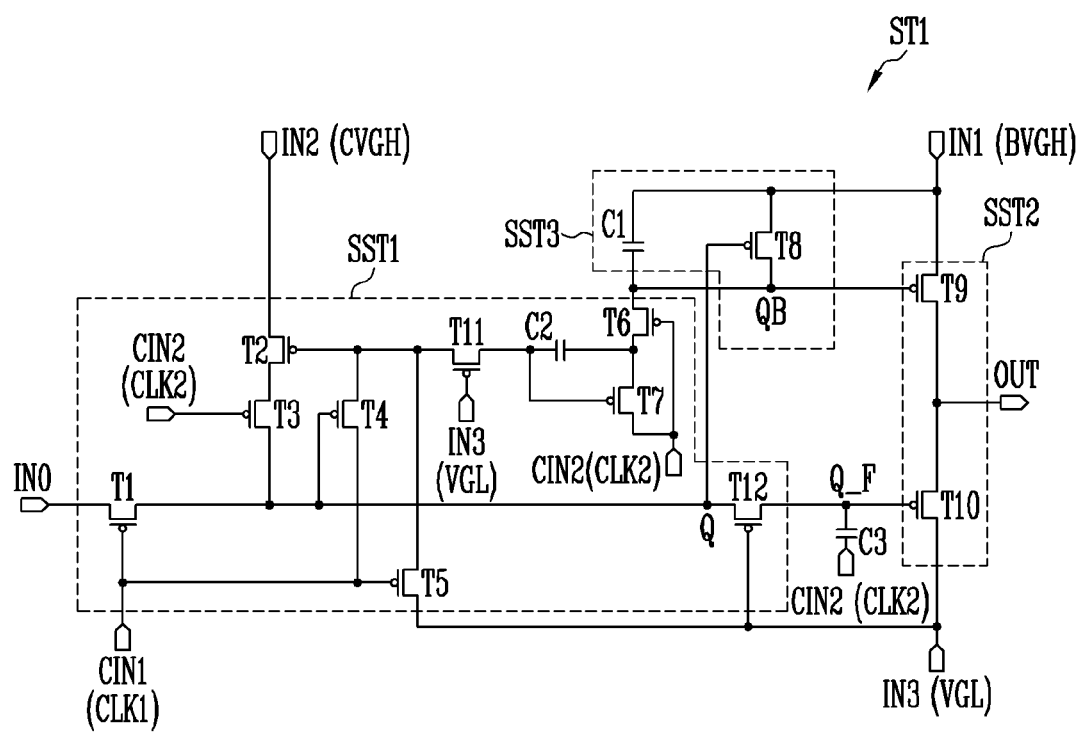

Referring to FIGS. 14 to 17, the first stage ST1 of FIGS. 17 and 16 may be substantially the same as or similar to the first stage ST1 of FIGS. 14 and 15 respectively except for a connection configuration of the third capacitor C3 and the third transistor T3. Therefore, an overlapping description is not be repeated.

As shown in FIGS. 16 and 17, the third transistor T3 may include a first electrode connected to the second electrode of the second transistor T2, a second electrode connected to the third control node Q, and a gate electrode connected to the second clock input terminal CIN2.

The third capacitor C3 may be formed between the second control node Q_F and the second clock input terminal CIN2 and may include a second electrode connected to the second control node Q_F and a first electrode connected to the second clock input terminal CIN2.

As described with reference to the sixth time point t6 of FIG. 6, the third transistor T3 and the third capacitor C3 may boost the voltage of the second control node Q_F to the fourth low level 2VGL+|Vth| in response to the second clock signal CLK2.

Similar to FIG. 15, the gate driver GDV including the first stage ST1 of FIG. 16 may operate according to the embodiment of FIG. 13. Similar to FIG. 14, the gate driver GDV including the first stage ST1 of FIG. 17 may operate according to the embodiment of FIG. 11 or the embodiment of FIG. 12.

Meanwhile, the first stage ST1 of FIGS. 16 and 17 may not include the thirteenth transistor T13 shown in FIGS. 14 and 15, but is not limited thereto.

As described above, a connection configuration of some elements (for example, the first capacitor C1, the thirteenth transistor T13, the third transistor T3, and the third capacitor C3) in the first stage ST1 may be variously modified.

Figure 18:
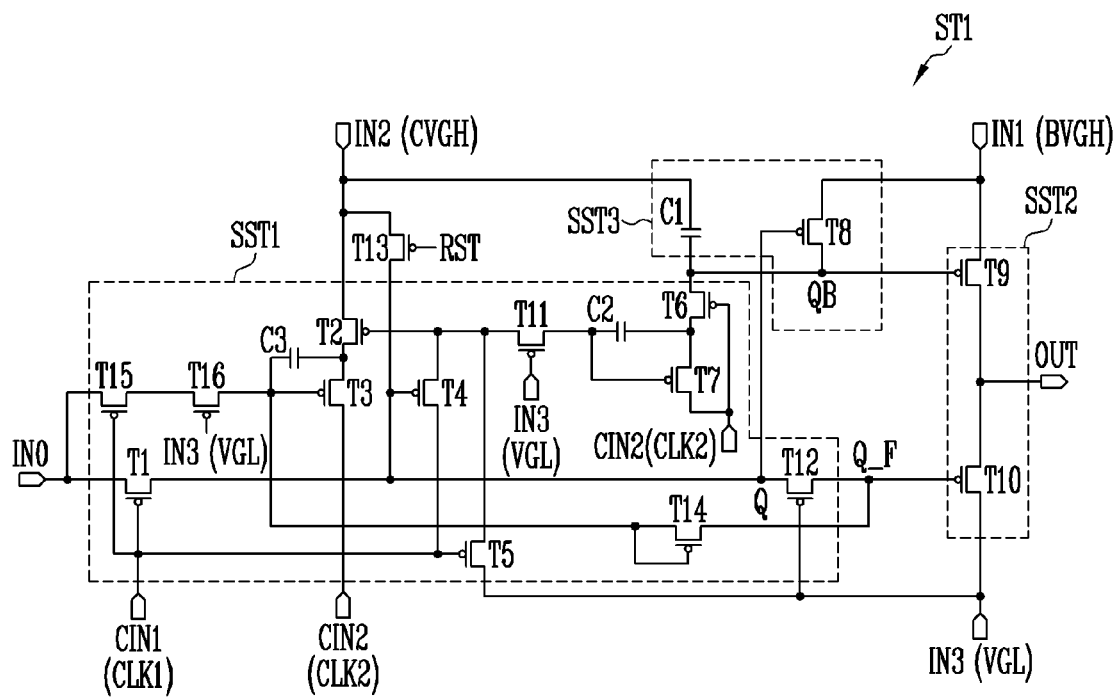
FIGS. 18 and 19 are circuit diagrams illustrating another embodiment of the first stage included in the gate driver of FIG. 4.
Figure 19:
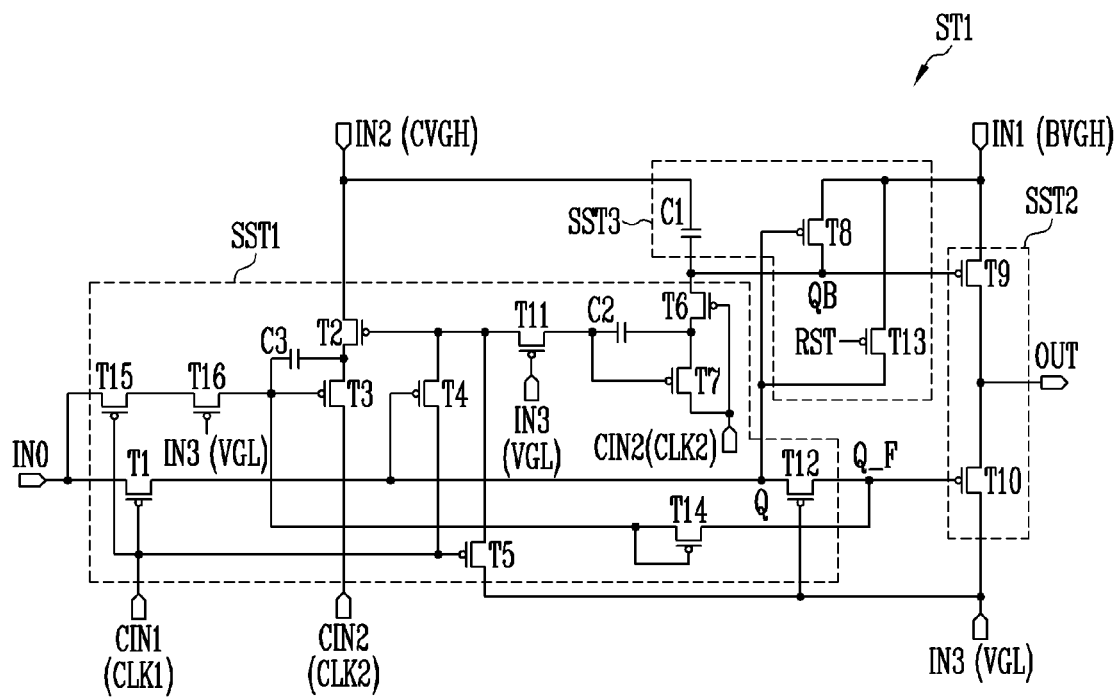

FIGS. 18 and 19 are circuit diagrams illustrating another embodiment of the first stage included in the gate driver of FIG. 4.

First, referring to FIGS. 4, 10, and 18, the first stage ST1 of FIG. 18 may be substantially the same as or similar to the first stage ST1 of FIG. 10 except for additional transistors, for example, fourteenth to sixteenth transistors T14 to T16. Therefore, an overlapping description is not be repeated.

The first stage ST1 may further include the fourteenth to sixteenth transistors T14 to T16.

The fourteenth transistor T14 (or a first auxiliary transistor) may include a first electrode connected to the gate electrode of the third transistor T3, a second electrode connected to the second control node Q_F, and a gate electrode connected to the gate electrode of the third transistor T3. That is, the fourteenth transistor T14 may be diode-connected between the gate electrode of the third transistor T3 and the second control node Q_F.

For reference, as described with reference to FIGS. 5 and 6, the voltage of the second control node Q_F of the first stage ST1 of FIG. 5 may alternately have the fourth low level 2VGL+|Vth| and the second low level VGL+|Vth| after the seventh time point t7. This is because the second clock signal CLK2 is transited from the first low level to the high level and the second clock signal CLK2 of the high level is applied to the first electrode of the third capacitor C3 through the third transistor T3 at the seventh time point t7.

After the voltage of the gate electrode of the third transistor T3 is changed to the fourth low level 2VGL+|Vth|), the fourteenth transistor T14 may constantly maintain the voltage of the second control node Q_F regardless of change of the voltage of the gate electrode of the third transistor T3. Therefore, after the seventh time point t7 described with reference to FIG. 6, the voltage of the second control node Q_F of FIGS. 18 and 19 may be maintained as the fourth low level VGL+2|Vth|, and the output voltage (or the gate signal) output through the output terminal OUT may be more stably maintained as the first low level (for example, reference gate power voltage VGL). In addition, since a rising and a falling of the voltage of the second control node Q_F does not exist, power consumption may be further reduced.

The fifteenth transistor T15 (or a second auxiliary transistor) may include a first electrode connected to the input terminal IN0, a second electrode connected to a first electrode of the sixteenth transistor T16, and a gate electrode connected to the first clock input terminal CIN1. The sixteenth transistor T16 (or a third auxiliary transistor) may include a first electrode connected to the second electrode of the fifteenth transistor T15, a second electrode connected to the gate electrode of the third transistor T3, and a gate electrode connected to the third power input terminal IN3.

The fifteenth transistor T15 may initialize the gate electrode of the third transistor T3 using the start signal (or a previous compensation gate signal) provided to the input terminal IN0 in response to the first clock signal CLK1 provided through the first clock input terminal CIN1. This is because the gate electrode of the third transistor T3 is not initialized by the second control node Q_F as the fourteenth transistor T14 is added.

The sixteenth transistor T16 may reduce or divide a bias voltage applied to the fifteenth transistor T15 between the input terminal IN0 and the gate electrode of the third transistor T3.

Each of the thirteenth to sixteenth transistors T13 to T16 may be a P-type transistor. As described with reference to FIG. 5, each of the thirteenth to sixteenth transistors T13 to T16 may be implemented as a single gate transistor or a dual gate transistor.

As described above, the first stage ST1 may remove a rising and a falling of the voltage of the second control node Q_F using the fourteenth to sixteenth transistors T14 to T16, and thus power consumption may be further reduced.

Meanwhile, in FIG. 18, the thirteenth transistor T13 is connected between the second power input terminal IN2 and the third control node Q, but the disclosure is not limited thereto. For example, as shown in FIG. 19, the thirteenth transistor T13 may be connected between the first power input terminal IN1 and the third control node Q.

Figure 20:
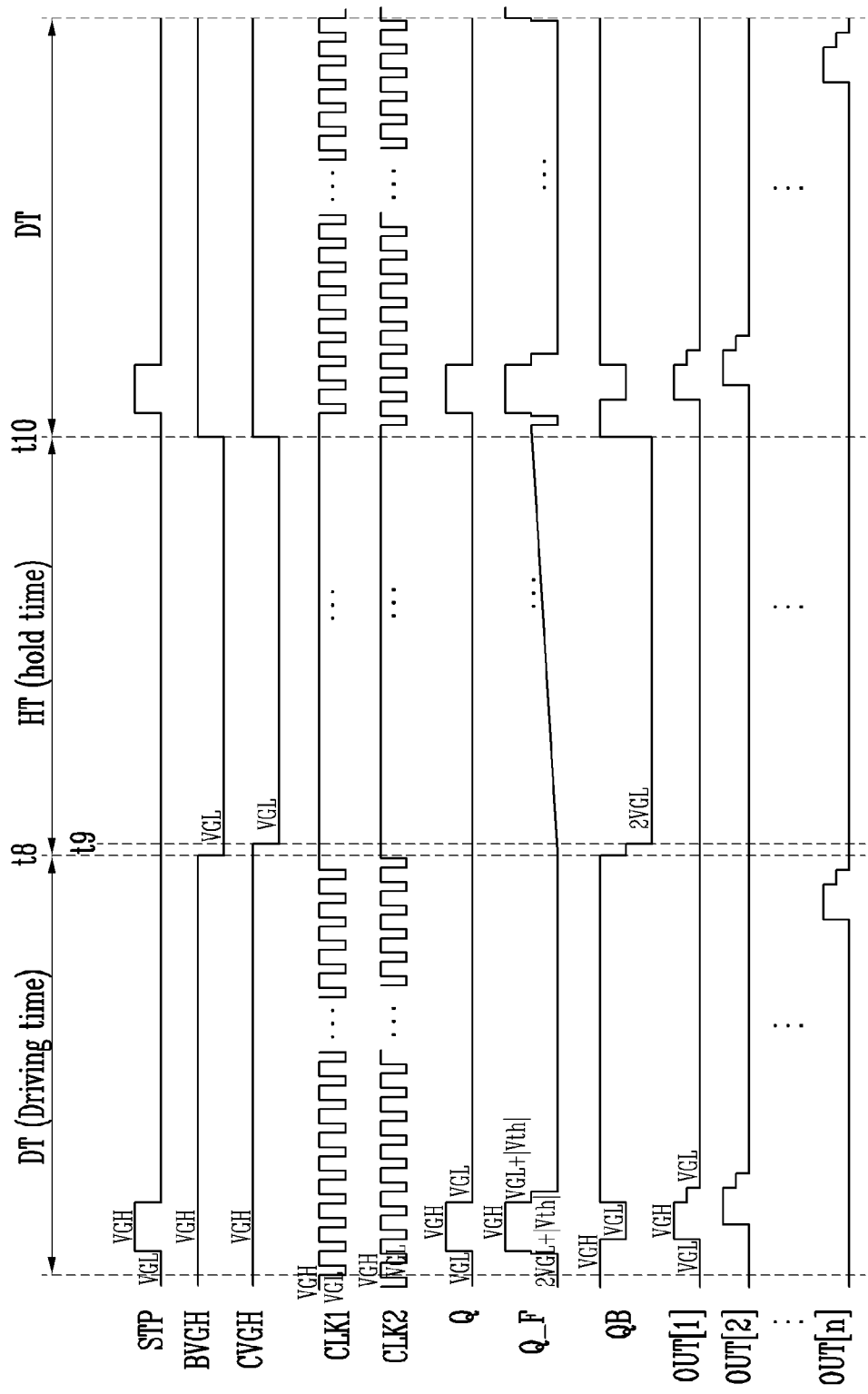
FIGS. 20, 21 and 22 are diagrams illustrating another embodiment of the operation of the gate driver of FIG. 4 in the second mode.
Figure 21:
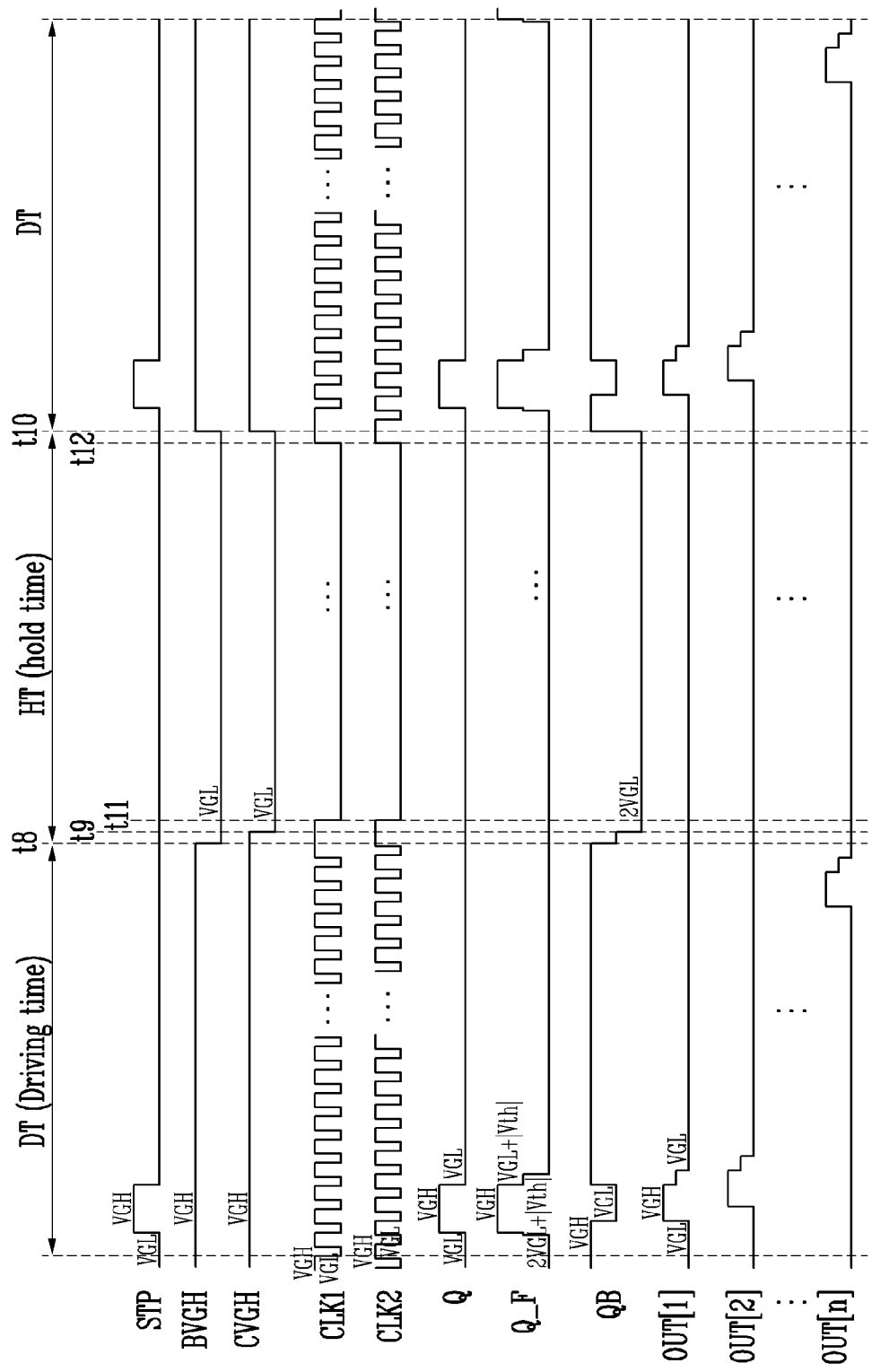
Figure 22:
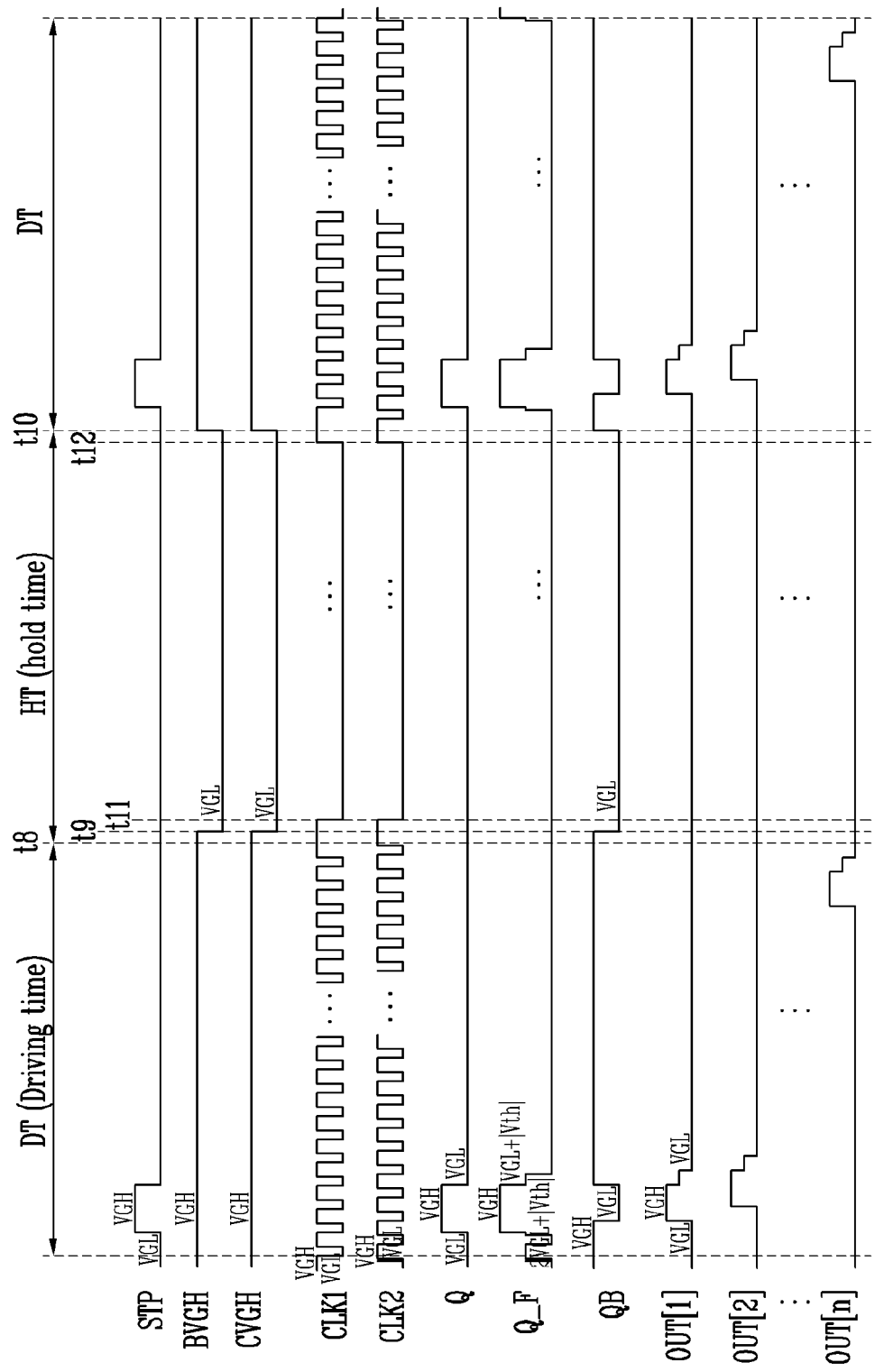

FIGS. 20 to 22 are diagrams illustrating another embodiment of the operation of the gate driver of FIG. 4 in the second mode. The embodiment of FIGS. 20 to 22 may be applied to the gate driver GDV including the first stage ST1 of FIGS. 18 and 19.

Referring to FIGS. 11 to 13 and 18 to 22, since signals shown in FIGS. 20 to 22 are substantially the same as the signals shown in FIGS. 11 to 13, respectively, except for the voltage of the second control node Q_F, an overlapping description is not be repeated.

By the fourteenth transistor T14 of FIG. 18, the voltage of the second control node Q_F may be generally maintained as the fourth low level 2VGL+|Vth|. For example, the voltage of the second control node Q_F may be maintained as the fourth low level 2VGL+|Vth| in the hold time HT and the driving time DT except for a partial period in which the gate signal of the high level (for example, the first output voltage OUT[1]) is generated.

Meanwhile, as shown in FIG. 20, when the first and second clock signals CLK1 and CLK2 are maintained as the high level in the hold time HT, the voltage of the second control node Q_F may gradually increase by leakage of the fourteenth transistor T14.

As shown in FIG. 21, when the first and second clock signals CLK1 and CLK2 are maintained as the first low level in the hold time HT, the second control node Q_F may be maintained as the fourth low level 2VGL+|Vth|.

During a period between the eleventh time point t11 and the twelfth time point t12, the second control node Q_F may be maintained as the fourth low level 2VGL+|Vth| by the second clock signal CLK2 and the third capacitor C3. Therefore, the first output voltage OUT[1] may be more robustly maintained as the first low level.

As shown in FIG. 22, in the hold time HT, the first and second gate power voltages BVGH and CVGH may simultaneously fall from the high level to the first low level.

Figure 23:
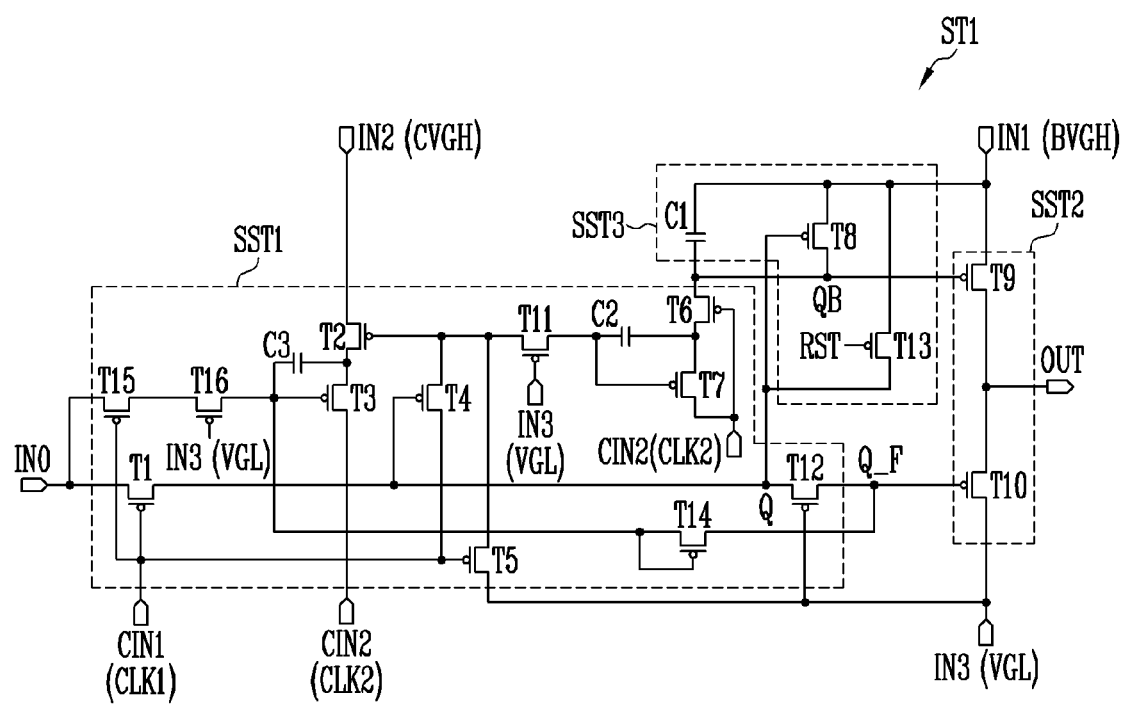
FIG. 23 is a circuit diagram illustrating another embodiment of the first stage included in the gate driver of FIG. 4.

FIG. 23 is a circuit diagram illustrating another embodiment of the first stage included in the gate driver of FIG. 4.

Referring to FIGS. 4, 19, and 23, the first stage ST1 of FIG. 23 may be substantially the same as or similar to the first stage ST1 of FIG. 19 except for a connection configuration of the first capacitor C1. Therefore, an overlapping description is not be repeated.

The first capacitor C1 may be formed between the first power input terminal IN1 and the first control node QB. A first electrode of the first capacitor C1 may be connected to the first power input terminal IN1 and a second electrode of the first capacitor C1 may be connected to the first control node QB. In this case, even though the first and second gate power voltages BVGH and CVGH are sequentially transited from the high level to the first low level, the boosting operation by the first capacitor C1 may not occur. Therefore, the gate driver GDV including the first stage ST1 of FIG. 23 may operate according to the embodiment of FIG. 20 or the embodiment of FIG. 21. However, the disclosure is not limited thereto, and for example, the gate driver GDV including the first stage ST1 of FIG. 23 may operate according to the embodiment of FIG. 22.

Figure 24:
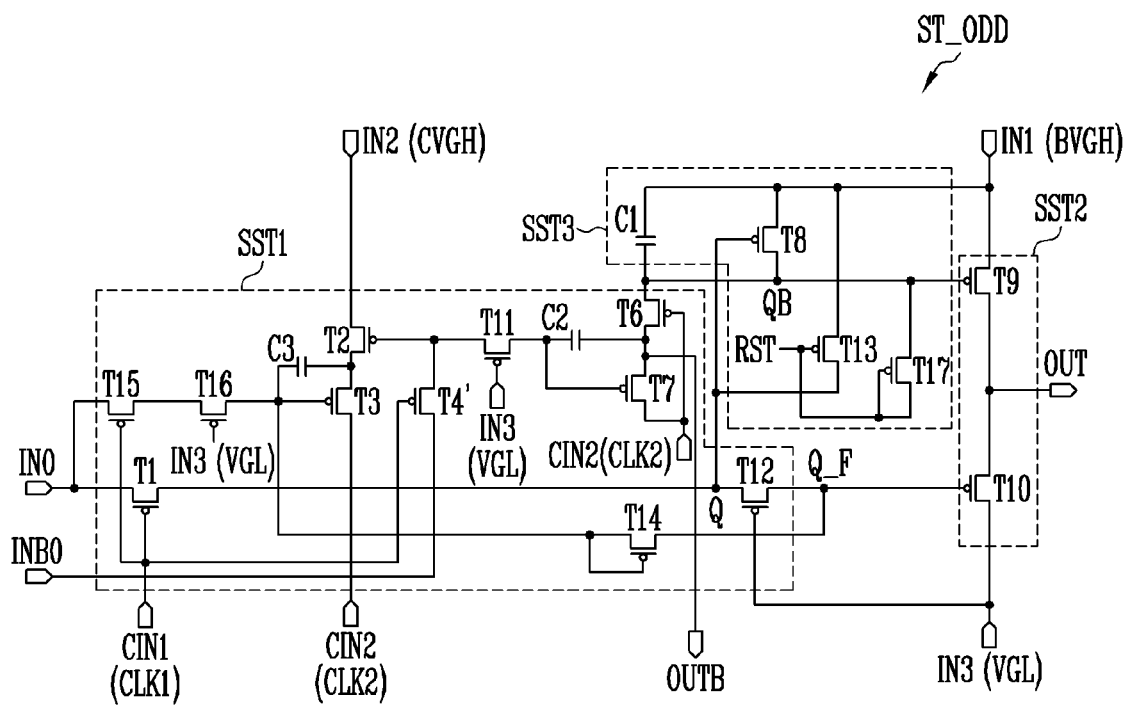
FIG. 24 is a circuit diagram illustrating an embodiment of a stage included in the gate driver of FIG. 4.

FIG. 24 is a circuit diagram illustrating an embodiment of a stage included in the gate driver of FIG. 4. FIG. 24 shows an embodiment of a stage ST_ODD positioned in an odd-numbered row among the stages ST1, ST2, and STn included in the gate driver GDV of FIG. 4.

Referring to FIGS. 4, 23, and 24, since the stage ST_ODD of FIG. 24 may be substantially the same as or similar to the first stage ST1 of FIG. 23 except for a carry input terminal INB0, a carry output terminal OUTB, a fourth transistor T4', and a seventeenth transistor T17. Therefore, an overlapping description is not be repeated.

The carry input terminal INB0 may be connected to the carry output terminal OUTB of a previous stage, and the carry output terminal OUTB may be connected to the carry input terminal INB0 of a subsequent stage. For example, the carry output terminal OUTB of the first stage ST1 (refer to FIG. 4) may be connected to the carry input terminal INB0 of the second stage ST2. In an embodiment, the first stage ST1 (refer to FIG. 4) may receive a carry signal from a dummy stage (for example, the stage disposed in front of the first stage ST1 according to the embodiment of FIG. 23). In another embodiment, only the first stage ST1 (refer to FIG. 4) may be implemented as one of the previous embodiments (for example, the stage according to the embodiment of FIG. 23). The first stage ST1 may include the carry output terminal OUTB and may not include the carry input terminal INB0. The carry input terminal INB0 and the carry output terminal OUTB are separately provided, but this is for convenience of description, and the disclosure is not limited thereto. For example, the carry input terminal INB0 and the carry output terminal OUTB may be lines connecting two adjacent stages.

The carry output terminal OUTB may be connected to the second electrode of the sixth transistor T6, the first electrode of the seventh transistor T7, and the second electrode of the second capacitor C2.

Operations of the carry signal (that is, the carry signal output through the carry output terminal OUTB) generated by the sixth transistor T6, the seventh transistor T7, and the second capacitor C2 in response to the second clock signal CLK2 may have a waveform corresponding to the second clock signal CLK2 only in a period between the third time point t3 and the fifth time point t5 described with reference to FIG. 6, and may be maintained as the high level (for example, gate power voltage VGH) in remaining periods. That is, during a period in which the gate signal is output through the carry output terminal OUTB, the second clock signal CLK2 may be output as the carry signal.

A first electrode of the fourth transistor T4' may be connected to the gate electrode of the second transistor T2, a second electrode of the fourth transistor T4' may be connected to the carry input terminal INB0, and a gate electrode of the fourth transistor T4' may be connected to the first clock input terminal CIN1.

The fourth transistor T4' may transfer the carry signal of the previous stage (that is, the carry signal applied to the carry input terminal INB0, for example, the second clock signal CLK2) to the gate electrode of the second transistor T2 in response to the first clock signal CLK1. The fourth transistor T4' may perform substantially the same function as the fourth transistor T4 (and the fifth transistor T5) of FIG. 23.

The seventeenth transistor T17 (or a reset transistor) may include a first electrode connected to the reset terminal RST, a second electrode connected to the first control node QB, and a gate electrode connected to the reset terminal RST. That is, the seventeenth transistor T17 may be diode-connected between the reset terminal RST and the first control node QB. The seventeenth transistor T17 may be turned on in response to a reset signal of a logic low level and may perform a reset operation so that the first control node QB has a logic low level. The third control node Q may be reset to a logic high level by the thirteenth transistor T13 and the first control node QB may be reset to a logic low level by the seventeenth transistor T17, simultaneously.

The gate driver GDV including the stage ST_ODD of FIG. 24 may operate substantially the same as the gate driver GDV including the first stage ST1 of FIG. 23. The gate driver GDV including the stage ST_ODD of FIG. 24 may operate according to the embodiment of FIG. 22, but is not limited thereto. For example, the gate driver GDV including the stage ST_ODD of FIG. 24 may operate according to the embodiment of FIG. 20 or the embodiment of FIG. 21.

In addition, at least a portion of a structure (for example, the fourth transistor T4', the seventeenth transistor T17, and a carry signal transfer configuration) of the stage ST_ODD of FIG. 24 may be applied to the previous embodiments.

Although the technical spirit of the disclosure has been described in detail in accordance with the above-described embodiments, it should be noted that the above-described embodiments are for the purpose of description and not of limitation. In addition, those skilled in the art may understand that various modifications are possible within the scope of the technical spirit of the disclosure.

The scope of the disclosure is not limited to the details described in the detailed description of the specification, but should be defined by the claims. In addition, it is to be construed that all changes or modifications derived from the meaning and scope of the claims and equivalent concepts thereof are included in the scope of the disclosure.

What is claimed is:

1. A gate driver comprising:
stages connected to clock signal lines to which clock signals are applied and a first gate power line to which a first gate power voltage is applied, and outputting the first gate power voltage as gate signals in response to the clock signals, wherein:
the clock signals have a first frequency and the first gate power voltage has a first voltage level in a first period,
the clock signals have a second frequency lower than the first frequency and the first gate power voltage has a second voltage level in a second period,
one of the first and second voltage levels is a gate-on voltage level that turns on a transistor and another of the first and second voltage levels is a gate-off voltage level that turns off the transistor.

2. The gate driver according to claim 1, wherein the second voltage level is lower than the first voltage level.

3. The gate driver according to claim 1, wherein the gate signals having the first voltage level are sequentially output in the first period, and
wherein the gate signals are maintained as the second voltage level during the second period.

4. The gate driver according to claim 1, wherein the stages are connected to a reference gate power line to which a reference gate power voltage having the second voltage level is applied, and
wherein a first stage among the stages includes at least one transistor and connects an output terminal to the first gate power line or the reference gate power line in response to the clock signals and a previous gate signal provided from a previous stage to output a gate signal through the output terminal.

5. The gate driver according to claim 4, wherein the clock signals are maintained as the first voltage level during the second period.

6. The gate driver according to claim 4, wherein the first gate power voltage falls from the first voltage level to the second voltage level in a state in which the clock signals are maintained as the first voltage level.

7. The gate driver according to claim 6, wherein the clock signal is maintained as the second voltage level during most of the second period.

8. The gate driver according to claim 7, wherein the first gate power voltage falls from the first voltage level to the second voltage level at a start time point of the second period, and
wherein the clock signals falls from the first voltage level to the second voltage level after the start time point.

9. The gate driver according to claim 8, wherein the first gate power voltage rises from the second voltage level to the first voltage level at an end time point of the second period, and
wherein the clock signals rise from the second voltage level to the first voltage level before the end time point.

10. The gate driver according to claim 4, wherein the stages are connected to a second gate power line to which a second gate power voltage is applied, and
wherein the first stage further comprises:
a node control circuit configured to control a voltage of a first control node in response to the clock signals and the previous gate signal; and
an output circuit connecting the first gate power line to the output terminal in response to the voltage of the first control node.

11. The gate driver according to claim 10, wherein the second gate power voltage has the first voltage level in the first period and has the second voltage level in the second period.

12. The gate driver according to claim 10, wherein the output circuit comprises:
a pull-up transistor including a first electrode connected to the first gate power line, a second electrode connected to the output terminal, and a gate electrode connected to the first control node; and
a pull-down transistor including a first electrode connected to the output terminal, a second electrode connected to the reference gate power line, and a gate electrode connected to a second control node.

13. The gate driver according to claim 10, wherein the clock signal lines include a first clock signal line and a second clock signal line, and
wherein the node control circuit comprises:
a first transistor including a first electrode connected to an input terminal, a second electrode, and a gate electrode connected to the first clock signal line;
a second transistor including a first electrode connected to the second gate power line, a second electrode, and a gate electrode;
a third transistor including a first electrode connected to the second electrode of the second transistor, a second electrode connected to the second clock signal line, and a gate electrode connected to the second control node;
a fourth transistor including a first electrode connected to the gate electrode of the second transistor, a second electrode connected to a carry input terminal, and a gate electrode connected to the first clock signal line;
a first coupling transistor including a first electrode connected to the first electrode of the fourth transistor, a second electrode, and a gate electrode connected to the reference gate power line;
a coupling capacitor including a first electrode connected to the second electrode of the first coupling transistor and a second electrode connected to a carry output terminal;
a sixth transistor including a first electrode connected to the first control node, a second electrode connected to the second electrode of the coupling capacitor, and a gate electrode connected to the second clock signal line; and
a seventh transistor including a first electrode connected to the second electrode of the coupling capacitor, a second electrode connected to the second clock signal line, and a gate electrode connected to the first electrode of the coupling capacitor, and
wherein a carry input terminal of a second stage among the stages is connected to the carry output terminal of the first stage.

14. The gate driver according to claim 13, wherein the first stage further comprises a reset transistor including a first electrode connected to a reset line, a second electrode connected to the first control node, and a gate electrode connected to the reset line.

15. The gate driver according to claim 10, wherein the first gate power voltage falls from the first voltage level to the second voltage level at a first time point of the second period,
wherein the second gate power voltage falls from the first voltage level to the second voltage level at a second time point of the second period, and
wherein the second time point is later than the first time point.

16. The gate driver according to claim 15, wherein the first gate power voltage and the second gate power voltage are simultaneously rise from the second voltage level to the first voltage level at a third time point of the second period, and wherein the third time point is later than the second time point.

17. The gate driver according to claim 15, wherein the clock signals falls from the first voltage level to the second voltage level at a fourth time point of the second period, and wherein the fourth time point is later than the second time point.

18. The gate driver according to claim 17, wherein the clock signals rise from the second voltage level to the first voltage level at a fifth time point of the second period, wherein the first gate power voltage rises from the second voltage level to the first voltage level at an end time point of the second period, and wherein the fifth time point is before the end time point.

19. The gate driver according to claim 10, wherein the clock signal lines include a first clock signal line and a second clock signal line, and wherein the node control circuit comprises:

a first transistor including a first electrode connected to an input terminal, a second electrode, and a gate electrode connected to the first clock signal line;

a second transistor including a first electrode connected to the second gate power line, a second electrode, and a gate electrode;

a third transistor including a first electrode connected to the second electrode of the second transistor, a second electrode connected to the second electrode of the first transistor, and a gate electrode connected to the second clock signal line;

a fourth transistor including a first electrode connected to the gate electrode of the second transistor, a second electrode connected to the first clock signal line, and a gate electrode connected to the second electrode of the first transistor;

a fifth transistor including a first electrode connected to the first electrode of the fourth transistor, a second electrode connected to the reference gate power line, and a gate electrode connected to the first clock signal line;

a first coupling transistor including a first electrode connected to the first electrode of the fifth transistor, a second electrode, and a gate electrode connected to the reference gate power line;

a coupling capacitor including a first electrode connected to the second electrode of the first coupling transistor, and a second electrode;

a sixth transistor including a first electrode connected to the first control node, a second electrode connected to the second electrode of the coupling capacitor, and a gate electrode connected to the second clock signal line; and a seventh transistor including a first electrode connected to the second electrode of the coupling capacitor, a second electrode connected to the second clock signal line, and a gate electrode connected to the first electrode of the coupling capacitor.

20. The gate driver according to claim 19, wherein the node control circuit further comprises:

a capacitor including a first electrode connected to the second control node and a second electrode connected to the second clock signal line; and a second coupling transistor including a first electrode connected to the second electrode of the first transistor, a second electrode connected to the second control node, and a gate electrode connected to the reference gate power line.

21. The gate driver according to claim 20, wherein the first stage further comprises a first capacitor including a first electrode connected to the second gate power line and a second electrode connected to the first control node.

22. The gate driver according to claim 20, wherein the first stage further comprises a first capacitor including a first electrode connected to the first gate power line and a second electrode connected to the first control node.

23. The gate driver according to claim 10, wherein the clock signal lines include a first clock signal line and a second clock signal line, and wherein the node control circuit comprises:

a first transistor including a first electrode connected to an input terminal, a second electrode, and a gate electrode connected to the first clock signal line;

a second transistor including a first electrode connected to the second gate power line, a second electrode, and a gate electrode;

a third transistor including a first electrode connected to the second electrode of the second transistor, a second electrode connected to the second clock signal line, and a gate electrode connected to the second control node;

a fourth transistor including a first electrode connected to the gate electrode of the second transistor, a second electrode connected to the first clock signal line, and a gate electrode connected to the second electrode of the first transistor;

a fifth transistor including a first electrode connected to the first electrode of the fourth transistor, a second electrode connected to the reference gate power line, and a gate electrode connected to the first clock signal line;

a first coupling transistor including a first electrode connected to the first electrode of the fifth transistor, a second electrode, and a gate electrode connected to the reference gate power line;

a coupling capacitor including a first electrode connected to the second electrode of the first coupling transistor, and a second electrode;

a sixth transistor including a first electrode connected to the first control node, a second electrode connected to the second electrode of the coupling capacitor, and a gate electrode connected to the second clock signal line; and a seventh transistor including a first electrode connected to the second electrode of the coupling capacitor, a second electrode connected to the second clock signal line, and a gate electrode connected to the first electrode of the coupling capacitor.

24. The gate driver according to claim 23, wherein the node control circuit further comprises:

a capacitor including a first electrode connected to the second electrode of the second transistor and a second electrode connected to the gate electrode of the third transistor; and a second coupling transistor including a first electrode connected to the second electrode of the first transistor, a second electrode connected to the second control node, and a gate electrode connected to the reference gate power line.

25. The gate driver according to claim 23, wherein the first stage further comprises an eighth transistor including a first electrode connected to the first gate power line, a second electrode connected to the first control node, and a gate electrode connected to the second electrode of the first transistor.

26. The gate driver according to claim 25, wherein the first stage further comprises a first capacitor including a first electrode connected to the first gate power line and a second electrode connected to the first control node.

27. The gate driver according to claim 25, wherein the first stage further comprises a reset transistor including a first electrode connected to the first gate power line, a second electrode connected to the second electrode of the first transistor, and a gate electrode connected to a reset line.

28. The gate driver according to claim 25, wherein the first stage further comprises a reset transistor including a first electrode connected to the second gate power line, a second electrode connected to the gate electrode of the fourth transistor, and a gate electrode connected to a reset line.

29. The gate driver according to claim 25, wherein the first stage further comprises a first capacitor including a first electrode connected to the second gate power line and a second electrode connected to the first control node.

30. The gate driver according to claim 29, wherein the node control circuit further comprises:
   a first auxiliary transistor including a first electrode connected to the gate electrode of the third transistor, a second electrode connected to the second control node, and a gate electrode connected to the gate electrode of the third transistor;
   a second auxiliary transistor including a first electrode connected to the input terminal, a second electrode, and a gate electrode connected to the first clock signal line; and
   a third auxiliary transistor including a first electrode connected to the second electrode of the second auxiliary transistor, a second electrode connected to the gate electrode of the third transistor, and a gate electrode connected to the reference gate power line.

31. A display device comprising:
   a display panel including gate lines and pixels connected to the gate lines;
   a gate driver including stages outputting gate signals to the gate lines;
   a timing controller configured to provide clock signals to the gate driver; and
   a power supply configured to provide a gate power voltage having a first voltage level and a reference gate power voltage having a second voltage level lower than the first voltage level to the gate driver,
   wherein each of the stages outputs the gate power voltage or the reference gate power voltage as a gate signal in response to the clock signal and a previous gate signal provided from a previous stage,
   wherein the power supply provides the gate power voltage having the first voltage level to the gate driver in a first period, and
   wherein the timing controller constantly maintains the clock signals as one of the first voltage level and the second voltage level, and the power supply provides the gate power voltage having the second voltage level to the gate driver during a second period.

32. The display device according to claim 31, wherein the clock signals are maintained as the first voltage level during the second period.

33. The display device according to claim 31, wherein the clock signal is maintained as the second voltage level during most of the second period.

34. The display device according to claim 33, wherein the gate power voltage falls from the first voltage level to the second voltage level at a first time point of the second period,
   wherein the clock signals falls from the first voltage level to the second voltage level at a second time point of the second period, and
   wherein the second time point is later than the first time point.

35. The display device according to claim 34, wherein the clock signals rise from the second voltage level to the first voltage level at a third time point of the second period,
   the gate power voltage rises from the second voltage level to the first voltage level at a fourth time point of the second period,
   the third time point is later than the second time point, and
   the fourth time point is later than the third time point.

* * * * *